United States Patent
Bertin et al.

(10) Patent No.: US 6,426,530 B1
(45) Date of Patent: Jul. 30, 2002

(54) HIGH PERFORMANCE DIRECT COUPLED FET MEMORY CELL

(75) Inventors: Claude L. Bertin, South Burlington; John E. Cronin, Milton; Erik L. Hedberg, Essex Junction, all of VT (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/568,663

(22) Filed: May 10, 2000

Related U.S. Application Data

(62) Division of application No. 09/002,825, filed on Jan. 5, 1998, now Pat. No. 6,137,129.

(51) Int. Cl.[7] .................. H01L 29/76; H01L 29/74; H01L 27/71
(52) U.S. Cl. ...................... 257/329; 257/903
(58) Field of Search .................. 257/135, 136, 257/263, 266, 60, 264, 265, 267, 302, 328, 329, 330, 331, 903, 904; 438/212, 242

(56) References Cited

U.S. PATENT DOCUMENTS

| | | | |
|---|---|---|---|
| 3,761,782 A | 9/1973 | Youmans | 257/778 |
| 3,884,733 A | 5/1975 | Bean | 438/128 |
| 3,986,196 A | 10/1976 | Decker et al. | 257/276 |
| 4,296,428 A | 10/1981 | Haraszti | 257/331 |
| 4,462,040 A | 7/1984 | Ho et al. | 257/302 |
| 4,466,173 A | 8/1984 | Baliga | 438/137 |
| 4,507,674 A | 3/1985 | Gaalema | 257/436 |
| 4,530,149 A | 7/1985 | Jastrzebski et al. | 438/156 |

(List continued on next page.)

FOREIGN PATENT DOCUMENTS

| | | |
|---|---|---|
| JP | 60-233911 | 11/1985 |
| JP | 6-177354 | * 6/1994 |

OTHER PUBLICATIONS

M.E. Kcker, Interconnecting Monolithic Circuit Elements, IBM Technical Disclosure Bulletin, vol. 10 No. 7, Dec. 1967, p. 883.

E.I. Alessandrini R.B. Laibowitz, Epitaxial Double–Sided Circuitry, IBM Technical Disclosure Bulleting, vol. 25 No. 10, Mar. 1983, pp. 5043–5044.

R.R. Garnache, Complimentary FET Memory Cell, IBM Technical Disclosure Bulletin, vol. 18 No. 12, May 1976, pp. 3947–3948.

Primary Examiner—Tom Thomas
Assistant Examiner—Hung Kim Vu
(74) Attorney, Agent, or Firm—Whitham, Curtis & Christofferson, P.C.

(57) ABSTRACT

A pair of directly coupled Field Effect transistors (FETs), a latch of directly coupled FETs, a Static Random Access Memory (SRAM) cell including a latch of directly coupled FETs and the process of forming the directly coupled FET structure, latch and SRAM cell. The vertical FETs, which may be both PFETs, NFETs or one of each, are epi-grown NPN or PNP stacks separated by a gate oxide, $SiO_2$. Each device's gate is the source or drain of the other device of the pair. The preferred embodiment latch includes two such pairs of directly coupled vertical FETs connected together to form cross coupled invertors. A pass gate layer is bonded to one surface of a layer of preferred embodiment latches to form an array of preferred embodiment SRAM cells. The SRAM cell may include one or two pass gates. The preferred embodiment SRAM process has three major steps. First, preferred embodiment latches are formed in an oxide layer on a silicon wafer. Second, the cell pass gates are formed on a pass gate or Input/Output (I/O) layer. Third, the I/O layer is bonded to and connected to the preferred latch layer.

10 Claims, 32 Drawing Sheets

U.S. PATENT DOCUMENTS

| | | | |
|---|---|---|---|
| 4,624,004 A | 11/1986 | Calviello | 257/276 |
| 4,675,717 A | 6/1987 | Herrero et al. | 257/777 |
| 4,692,791 A | 9/1987 | Bayraktaroglu | 257/664 |
| 4,767,722 A | 8/1988 | Blanchard | 438/270 |
| 4,794,093 A | 12/1988 | Tong et al. | 438/584 |
| 4,807,022 A | 2/1989 | Kazior et al. | 257/713 |
| 4,810,906 A | 3/1989 | Shah et al. | 326/121 |
| 4,889,832 A | 12/1989 | Chatterjee | 438/270 |
| 4,927,784 A | 5/1990 | Kazior et al. | 438/584 |
| 4,951,102 A | 8/1990 | Beitman et al. | 257/329 |
| 4,956,687 A | 9/1990 | de Bruin et al. | 257/439 |
| 4,982,266 A | 1/1991 | Chatterjee | 257/66 |
| 5,001,526 A | 3/1991 | Gotou | 257/302 |
| 5,021,845 A | 6/1991 | Hashimoto | 257/331 |
| 5,027,189 A | 6/1991 | Shannon et al. | 257/783 |
| 5,032,529 A | 7/1991 | Beitman et al. | 438/212 |
| 5,034,347 A | 7/1991 | Kakihana | 438/667 |
| 5,057,450 A | 10/1991 | Bronner et al. | 438/412 |
| 5,063,177 A | 11/1991 | Geller et al. | 438/207 |
| 5,072,276 A | 12/1991 | Malhi et al. | 257/372 |
| 5,134,448 A | 7/1992 | Johnsen et al. | 257/330 |
| 5,252,849 A | 10/1993 | Fitch et al. | 257/329 |
| 5,292,686 A | 3/1994 | Riley et al. | 438/605 |
| 5,293,053 A | 3/1994 | Malhi et al. | 257/330 |
| 5,322,816 A | 6/1994 | Pinter | 438/667 |
| 5,343,071 A | 8/1994 | Kazior et al. | 257/621 |
| 5,354,711 A | 10/1994 | Heitzmann et al. | 438/638 |
| 5,449,930 A | 9/1995 | Zhou | 257/197 |
| 5,455,064 A | 10/1995 | Chou et al. | 427/71 |
| 5,528,080 A | 6/1996 | Goldstein | 257/741 |
| 5,627,390 A | 5/1997 | Maeda et al. | 257/302 |

\* cited by examiner

HIGH PERFORMANCE DIRECT COUPLED FET MEMORY CELL

RELATED APPLICATION

The present invention is a divisional of U.S. patent application Ser. No. 09/002,825 filed on Jan. 5, 1998, U.S. Pat. No. 6,137,129 which application is hereby incorporated by reference. This divisional is also related to U.S. patent application Ser. No. 09/002,399 U.S. Pat. No. 6,297,531 entitled "High Performance, Low Power Vertical Integrated CMOS Logic Devices" to Armacost et al., filed coincident herewith and assigned to the assignee of the present application.

BACKGROUND OF THE INVENTION

1. Field of the Invention

The present invention generally relates to semiconductor devices and more particularly to field effect transistors (FETs).

2. Background Description

High performance (fast) Static Random Access Memories (SRAMs) are crucial in achieving high performance in state of the art computer systems. High Performance arrays may be integrated into a microprocessor as on-chip memory, sometimes called a level 1 (L1) cache. The microprocessor may access Data and execute instructions in the L1 cache very quickly, avoiding data transfer delays that normally occur in off-chip information transfers.

In addition to the L1 cache, a stand-alone high performance SRAM, sometimes called a level 2 (L2) cache may be strategically located between the microprocessor and a relatively slow main memory to further boost system performance. Typically, L2 cache performance matches or nearly matches microprocessor speed. By keeping larger subroutines with currently executing instructions and data in the L2 cache, so that all memory appears to the microprocessor to be as fast as the L2 cache, the microprocessor may run at or near its top speed, maximizing system performance.

State of the art SRAMs are made in the complimentary insulated gate Field Effect Transistor (FET) technology, commonly referred to as CMOS, to minimize power dissipation. Each cell includes a pair cross coupled invertors coupled to a bit line by one or more pass gates. Each inverter includes one P-type FET (PFET) and one N-type FET (NFET). Typically, the pass gates are NFETs. CMOS SRAM storage cell designs are optimized for density or performance.

The densest state of the art SRAMs cells, presently, are stacked complementary pairs of FETs sharing a common gate sandwiched between them. Normally, the PFET is stacked above the NFET. Each such stacked pair forms a CMOS inverter. Two such stacked pairs are cross coupled as the cell latch. These cross coupled stacked transistor invertors form a very dense CMOS cell.

However, the density realized from stacking the FETs may be offset by the resulting relatively poor electrical device characteristics of stacked devices (especially for the PFET) as compared to normal bulk FETs, which are typically twice as fast. Bulk FETs provide better performance than stacked device cells, but are larger, because of less efficient wiring. These high performance bulk cells typically require three interconnection levels including a special cell wiring layer and 2 normal chip metal level.

As might be expected, latch stability is crucial to the integrity of data stored therein. Prior art SRAM latches were relatively large and relatively slow compared to state of the art SRAM latches. The energy needed to switch a prior art SRAM latch from one state to another was large, so cell stability was not an issue.

However, the latches in state of the art SRAM cells are sensitive to cosmic rays and alpha particles. To counteract this sensitivity, stabilizing capacitance is added to the storage nodes in state of the art SRAM cell latches. This added capacitance has little impact on cell write time and no impact on cell read time. So, state of the art CMOS SRAM storage cell designs include this capacitance to add stability while attempting to avoid any significant impact on cell size.

SUMMARY OF THE INVENTION

It is therefore a purpose of the present invention to reduce latch size.

It is another purpose of the present invention to improve SRAM speed, density and power.

It is yet another purpose of the present invention to improve/reduce CMOS latch size.

It is yet another purpose of the present invention to improve SRAM cell stability and cell density.

The present invention is a directly coupled pair of Field Effect transistors (FETs), a latch including at least one pair of directly coupled FETs, a Static Random Access Memory (SRAM) cell including at least one pair of directly coupled FETs in a latch and the process of forming the directly coupled FET structure, latch and SRAM cell.

The FETs are, preferably, a pair of vertical epitaxial stacks separated by a gate oxide with channel regions formed such that each device's source or drain is the gate of the other device. The preferred embodiment latch includes two such pairs of directly coupled FETs connected together to form cross coupled invertors. A pass gate layer is bonded to one surface of a layer of preferred embodiment latches to form an array of preferred embodiment SRAM cells. In one embodiment, the SRAM Cell includes one pass gate. In another embodiment, the SRAM cell includes two pass gates.

As preferred embodiment SRAM cells include preferred embodiment latches and preferred embodiment latches include preferred embodiment directly coupled FET pairs the preferred embodiment process of forming SRAM cells includes the process of forming the preferred latch and the preferred directly coupled FET pairs. There are three major steps in the preferred embodiment SRAM process. First, preferred embodiment latches are formed in an insulator layer on a semiconductor wafer, preferably $SiO_2$ on silicon. Second, the cell pass gates are formed on a pass gate layer, referred to herein as an Input/Output (I/O) layer. Third, the I/O layer is bonded to and connected to the latch layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
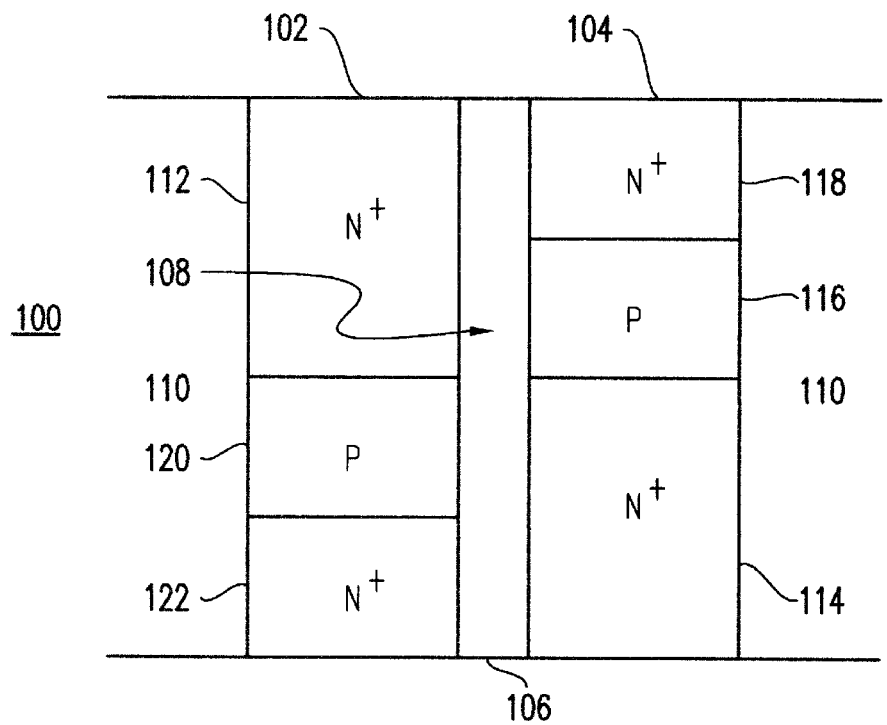
FIGS. 1A–C is a cross-sectional view of a pair of preferred embodiment directly coupled vertical FETs and schematic representations thereof.

FIG. 1A is a representation of the preferred embodiment pair of directly coupled vertical FETs 100. The pair 100 is formed by epitaxially growing two NPN layered semiconductor stacks 102, 104 on a semiconductor surface 106. Preferably, the semiconductor material is silicon. Although, in the example of FIG. 1A, two NPN stacks 102, 104 are shown, this is for example only. The stacks may be two PNP stacks, or one NPN and one PNP stack.

The two NPN stacks 102, 104 are separated by a thin gate oxide layer 108, preferably $SiO_2$. The pair is isolated on either side by an appropriate insulating material 110. One conducting terminal layer (i.e., a source or drain layer) 112, 114 in each NPN stack 102, 104, respectively, is grown to be as thick as the other stack's remaining layers 116, 118 or 120, 122, respectively. As a result, an FET is formed from each stack 102, 104 with layer 114 being directly coupled to layer 108, forming the gate for stack 102 and with layer 112 being directly coupled to layer 116, forming the gate for stack 104. Thus taking 118 and 122 to be the sources of the two FETs, the structure 100 of FIG. 1A forms two cross-coupled N-type FETs (NFETs) 124 in FIG. 1B. The channel length of each FET 102, 104 is determined by the thickness of channel layer 116, 120, respectively. Each device's width is determined by the width of the stack 102, 104 along the gate oxide layer 108, i.e. into the page in FIG. 1A.

The preferred embodiment structure of FIG. 1A may be further expanded. For example, by forming a third NPN stack, identical to stack 102, to the right of stack 104 and separated from stack 104 by a gate oxide layer identical to gate oxide layer 108, a third directly coupled device may be added. Thus, the number of directly coupled devices may be expanded indefinitely by providing appropriately placed stacks.

As noted hereinabove, one stack, e.g., stack 104, may be a PNP stack to form a P-type FET (PFET). The resulting structure is a directly coupled NFET/PFET pair 126 in FIG. 1C. For such a directly coupled NFET/PFET pair 126, the device threshold voltages and performance is not as desirable as for the preferred directly coupled pair 124.

By placing two such NFET/PFET pairs 126 adjacent to one another, they may be coupled together with appropriate wiring connections to form a very small (dense) latch of complementary devices, referred to normally as a CMOS latch. An array of dense CMOS latches of two adjacent NFET/PFET pairs 126 uses very little surface area and is only a fraction of the area of an array of traditional CMOS latches.

Figure 2:
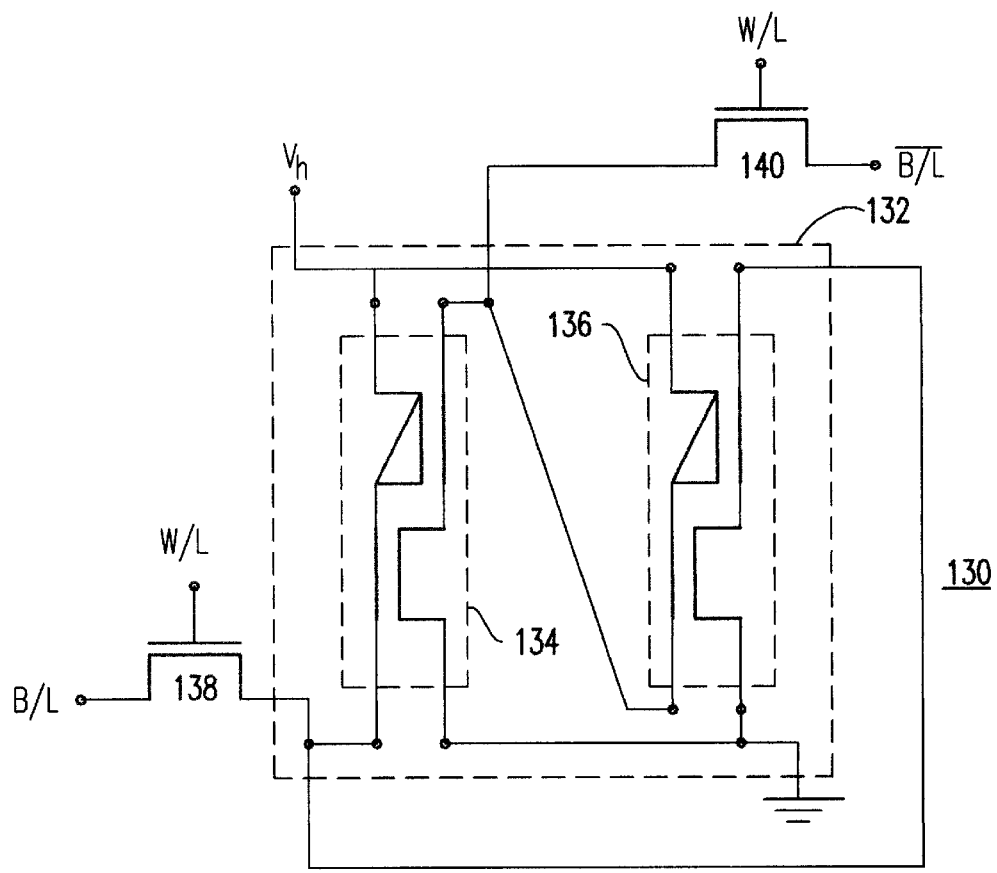
FIG. 2 is a preferred embodiment SRAM cell 130 formed from the preferred embodiment CMOS latch.

FIG. 2 is a preferred embodiment SRAM cell 130 formed from the preferred embodiment CMOS latch 132, which includes two vertical cross coupled PFET/NFET pairs 134, 136. The cell 130 includes appropriate means for reading and writing the latch 132, in this example, for performance, a pair of pass gates 138, 140. For added density, either pass gate 138 or 140 may be omitted. The pass gates 138, 140 are, preferably, horizontal NFETs provided in semiconductor layers above the latch 132. Such a preferred embodiment SRAM cell 130 is very dense, roughly one fifth the size of a typical prior art horizontal CMOS SRAM cell in a comparable technology.

As with any equivalent prior art SRAM cell, the cell 130 of FIG. 2 is written by driving bit line (B/L) high/low, bit line bar ($\overline{B/L}$) low/high and then driving the word line (W/L) high. Data is read from the cell 130 by driving W/L high and sensing any differential voltage between B/L and $\overline{B/L}$.

Pass gate device 138 or 140 may be omitted from the 6 transistor cell of FIG. 2 to form a preferred embodiment 5 transistor cell. Such a 5 transistor cell, as with any equivalent prior art 5 transistor SRAM cell, is written by forcing the single bit line (B/L) high or low and then driving the word line (W/L) high. Data may be read from the 5 transistor cell by driving W/L high and sensing any change in voltage on B/L.

Figure 3A:
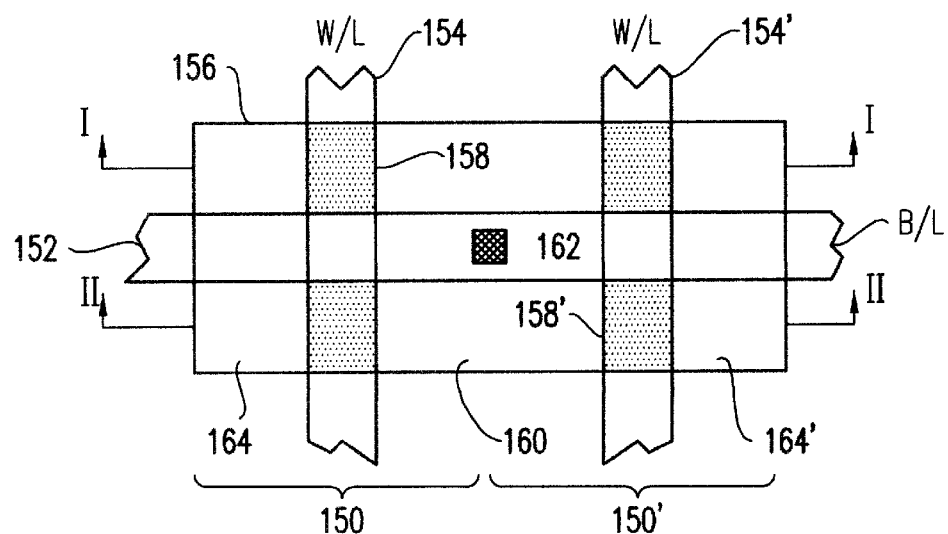
FIGS. 3A–C is a cross-sectional view of two preferred embodiment single pass gate cells.
Figure 3B:
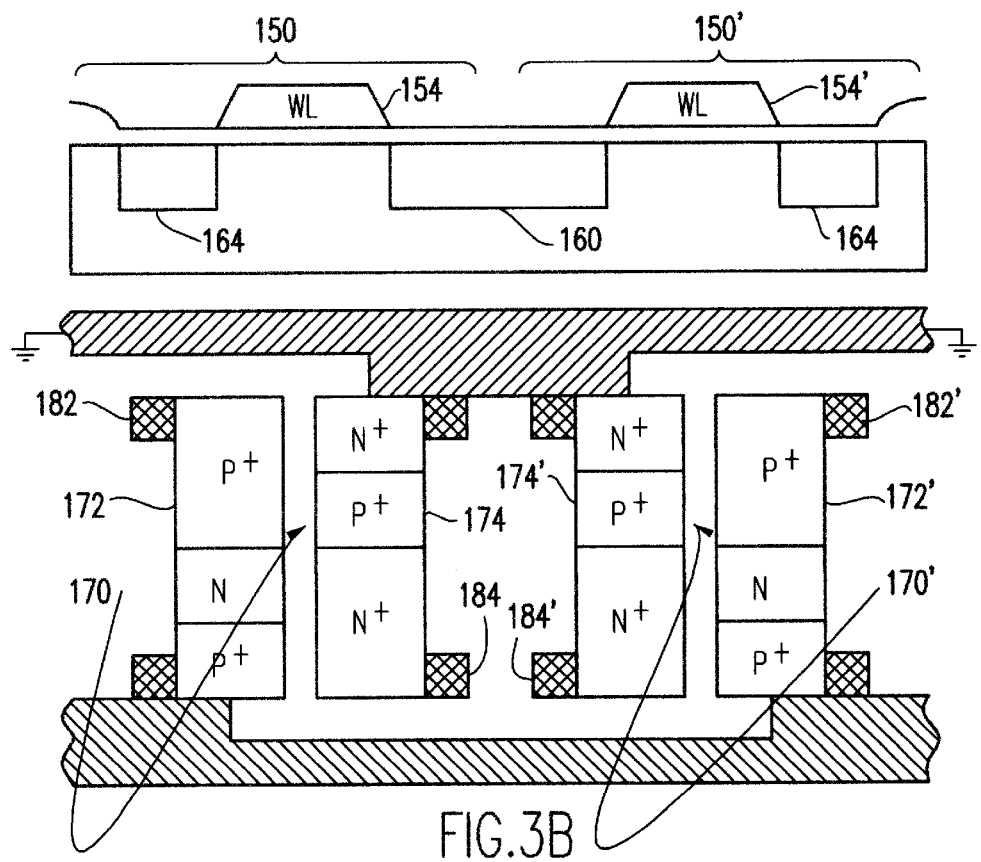
Figure 3C:
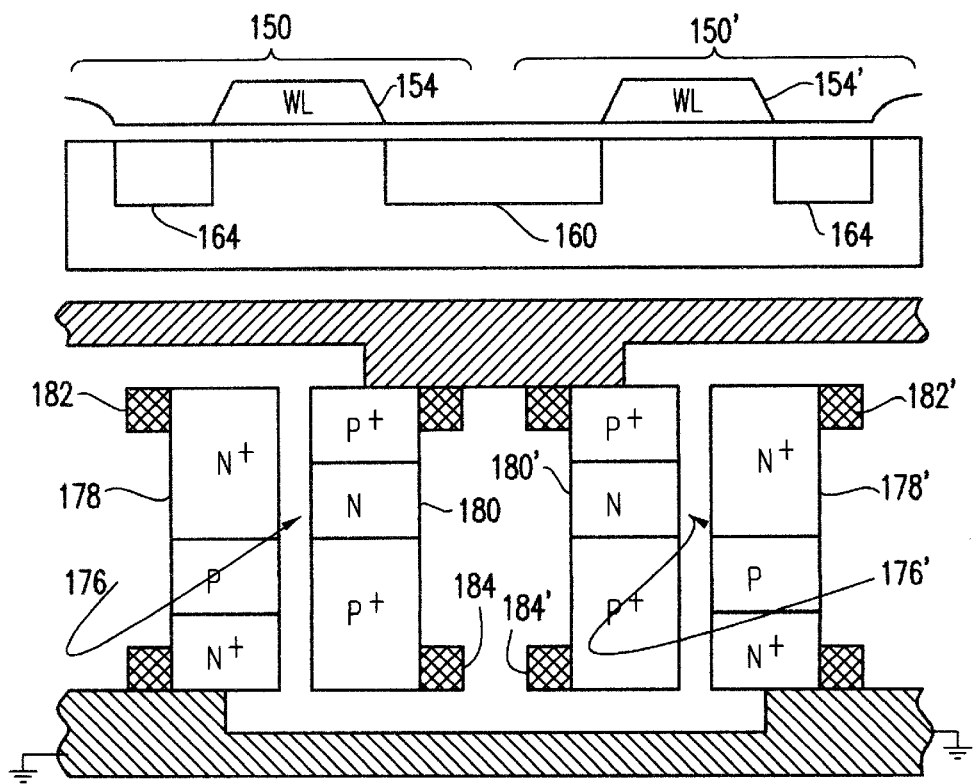

FIGS. 3A–C represent a preferred embodiment of single pass gate cells 150, 150' in which either pass gate 138 or 140 in FIG. 2 is omitted. FIG. 3A is a top view of the cell area, showing a bit line 152 and two word lines 154, 154', with the cell latches therebelow. Each word line 154, 154' crosses a thin oxide region forming the gate of one of the pass gates 158, 158'. Area within rectangle 156 not under a word line 154, 154' is diffusion. The bit line contacts Drain diffusion 160 between the two pass gates 158, 158' through contact 162. Source diffusions 164, 164' contact each of the two latches therebelow, as represented in the cross sections in FIGS. 3B–C through section lines I and II. Thus, each pass gate 150 and 150' is connected to one of the two flip-flops below the I/O layer.

There are two latches (of flip-flop storage nodes) such as latch 132 of FIG. 2 under each of the two input/output (flip-flop selection) transistors of FIG. 3A. Cross section line I of FIG. 3A is shown in FIG. 3B. In addition to input/output device cross sections for devices 150 and 150', FIG. 3B also shows flip-flop cross sections for half (a cross-coupled vertical NFET/PFET pair) of each of the two flip-flop storage nodes. Cross section line II of FIG. 3A is shown in FIG. 3C. In addition to input/output device cross sections for devices 150 and 150', FIG. 3C also shows flip-flop cross sections for the other half (a cross-coupled vertical NFET/PFET pair) of each of the two flip-flop storage nodes. The first flip-flop latch (left hand side) is formed by connecting latch half 170 of FIG. 3B to latch half 176 of FIG. 3C. Wires 182 and 184, perpendicular to the page, are used to interconnect flip-flop latch halves 170 and 176, thus forming the first flip-flop latch 132 (left hand side). The latch is powered by a ground connection to stack 174 and power supply connection to stack 172 of FIG. 3B, and ground connection to stack 178 and a power supply connection to stack 180 in FIG. 3C. Single pass gate device 150 is connected to the first flip-flop (left side) at diffusion 164 (the connection is not shown in this cross sectional view). Word line 154 is used to select the first flip-flop. The bit line contact 160 is common to (is shared by) both flip-flops (the left and right side flip-flops). The second flip-flop latch (right hand side) is formed by connecting latch half 170' of FIG. 3B to latch half 176' of FIG. 3C. Wires 182' and 184', perpendicular to the page, are used to interconnect flip-flop latch halves 170' and 176', thus forming the second flip-flop latch 132 (right hand side). The latch is powered by a ground connection to stack 174' and power supply connection to stack 172' of FIG. 3B, and ground connection to stack 178' and power supply connection to stack 180' in FIG. 3C. Single pass gate device 150' is connected to the second flip-flop (right side) at diffusion 164' (the connection is not shown in this cross sectional view). Word line 154' is used to select the second flip-flop. The bit line contact 160 is common to (is shared by) both flip-flops (the left and right side flip-flops). Thus, by burying the vertical left side latch formed by 170, 176 and the vertical right side latch formed by 170', 176', the area of each SRAM cell approaches that of a Dynamic RAM (DRAM) cell.

Figure 4A:
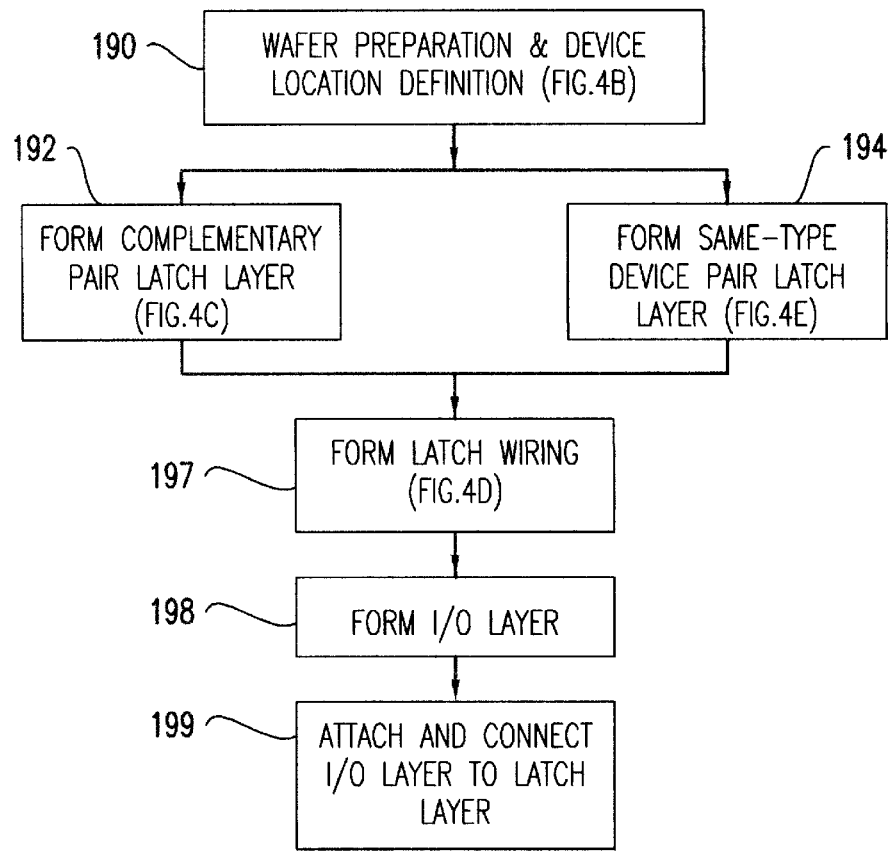
FIGS. 4A–E are flow diagrams representing these three major steps for forming the preferred embodiment SRAM cells.

There are three major steps in forming preferred embodiment SRAM cells in FIGS. 3A–C. FIG. 4A is a flow diagram representing these three major steps for forming the preferred embodiment SRAM cells. The first major step, wherein latches are formed in an insulator layer on a semiconductor wafer, preferably $SiO_2$ on silicon is represented as multiple steps 190, 192 and 197 or 190, 194 and 197 as is further explained below. Second, in step 198, the cell pass gates are formed on a layer, referred to herein as an Input/Output (I/O) layer. Third, in step 199, the I/O layer is bonded to and connected to the latch layer.

Each of FIGS. 4B–E represent one of steps 190, 192, 194 and 197, wherein steps 190 and 197 are common to each of the preferred embodiments and steps 192 and 194 represent differences between preferred embodiments. Thus, in FIG. 4A regardless of the particular preferred embodiment, in step 190, the wafer is prepared and cell device locations are defined as provided in FIG. 4B. If the cell latches are formed using the complementary device pair of FIG. 1C, then in step 192, the latch layer is formed. If, however, the cell latches are formed using the same-type device pair of FIG. 1B, then the latch layer is formed in step 194. Then, for either latch layer, in step 197, layer wiring is formed.

Figure 4B:
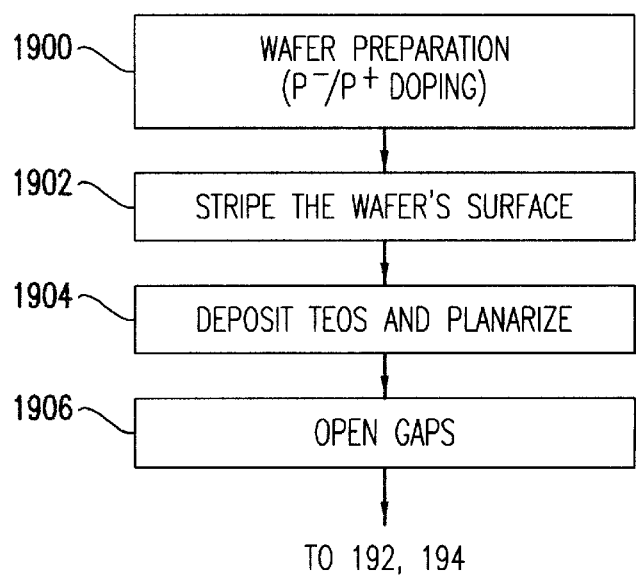

In step 1900 of FIG. 4B, the wafer is prepared. Thus, a silicon substrate, for example, is doped with a P-type dopant to have a P−/P+ doping profile. Alternatively, an N-type wafer could be substituted with appropriate process modification without departing from the spirit or scope of the present invention.

Figure 5A:
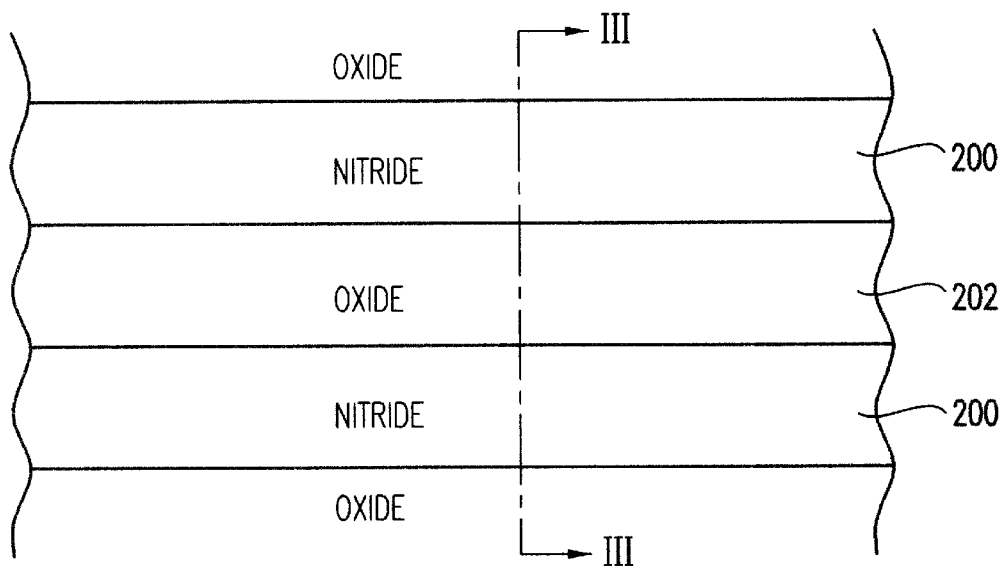
FIGS. 5A–D are plan and corresponding cross-sectional views of a wafer in the preparation steps for forming latches thereon according to the preferred embodiments of the present invention.

FIGS. 5A–D to 13A–B represent the steps in forming the latch layer according to a first preferred embodiment as in steps 190, 192, 197. In step 1902, as represented in FIG. 5A, the surface of the wafer is striped with nitride (SiN) lines 200. An optional thin pad oxide layer, 5–10 nm thick, may be formed on the exposed silicon wafer for stress relief. Then, two or more nitride lines 200 are formed on the surface. The nitride stripes 200 or, lines 200, may be formed photo lithographically, or by any other suitable technique. The stripes 200 are 0.4–1.0 um thick and, typically controlled to ±10% of the intended height of the vertical device stack. Preferably, the stripes are oriented such that vertical sidewalls of vertical devices formed therein lie in the wafer's <100> plane to achieve maximum carrier mobility and minimum surface state density.

Figure 5B:
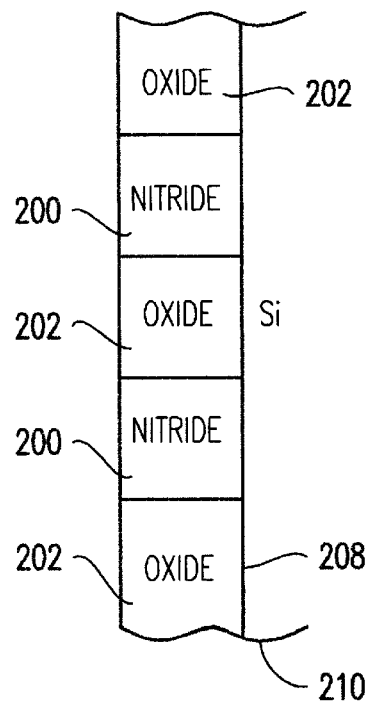

Then, in step 1904, the spaces 202 between the stripes 200 are filled with oxide. The oxide layer, preferably formed by decomposition of tetra-ethyl-oxi-silane (TEOS), is formed on the striped surface and planarized, preferably using chem-mech polishing (CMP), to the nitride resulting in the structure of FIG. 5B, which is a cross section of FIG. 5A through section line III. FIG. 5B shows the spaces 202 between the stripes 200 the surface 208 of the underlying silicon wafer 210. Optionally, if needed, the TEOS may be thermally densified.

The number of pairs of nitride lines formed is determined by the number of latches desired. Thus, although in FIGS. 5A–B only two nitride lines are shown and, in subsequent figures, only four lines are shown, numerous unshown lines are formed coincident therewith both above and below the shown lines.

Figure 5C:
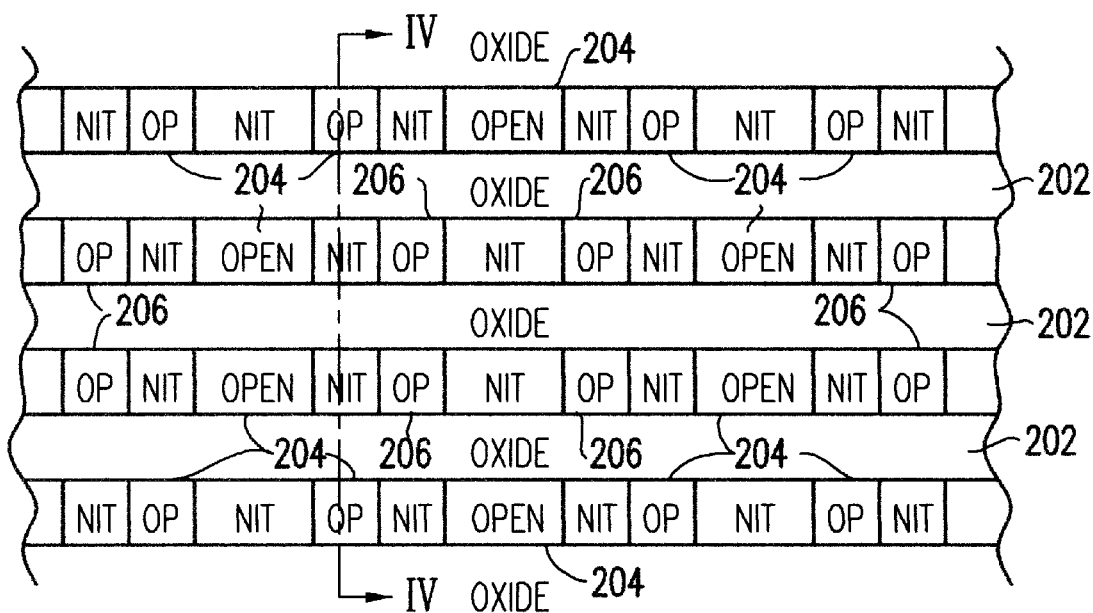
Figure 5D:
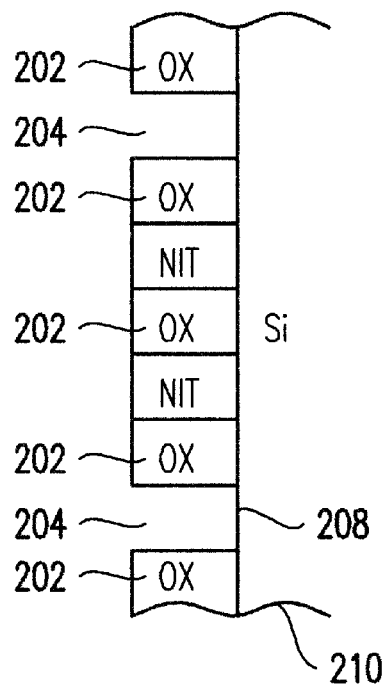

Next in step 1906, as represented in FIGS. 5C–D, wherein FIG. 5D is a cross section of FIG. 5C through section line IV, gaps 204, 206 are formed through the nitride lines 200 to the surface 208 of the underlying silicon wafer 210, defining NPN stack (NFET) locations. Preferablely, the openings are defined photo lithographically and, then, using an etchant selective to oxide, the openings are etched down to the pad oxide (not shown). Once exposed, because of its thinness relative to the TEOS spaces 202, the thin pad oxide may be etched away to the silicon surface 208, without the etch having any significant effect on the TEOS spaces 202.

Figure 4C:
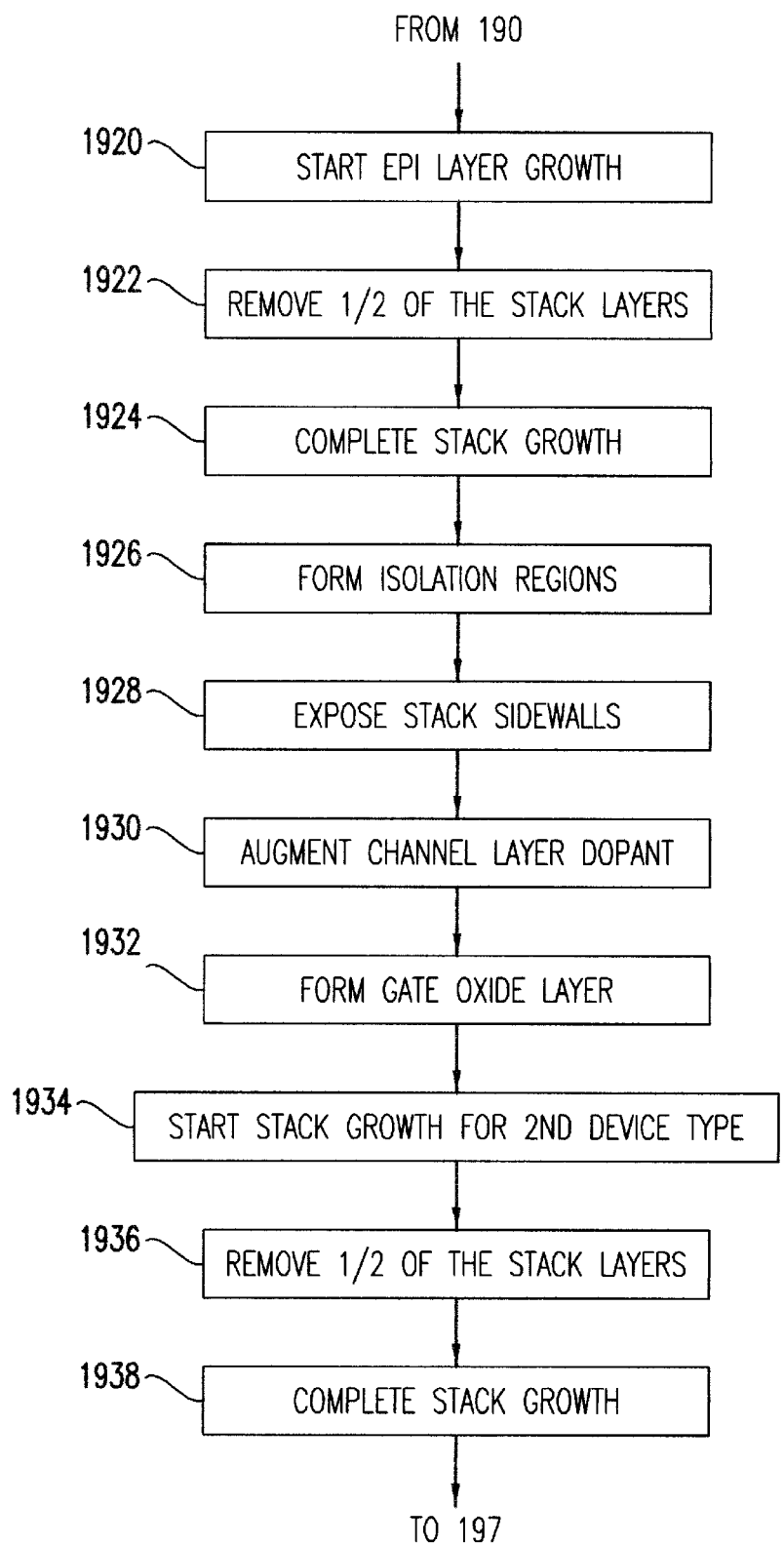

In step 1920 of FIG. 4C, after opening gaps 204, 206 in the nitride lines 200, a thin doped epitaxial layer (not shown) is grown in the gaps 204, 206 on the exposed silicon. Preferably, the thin doped epi layer is a 0.1 um thick layer of $N^+$ silicon. As referred to herein $N^+$ or $P^+$ regions are doped with an appropriate dopant to $10^{19}$–$10^{20}$ and $N^-$ and $P^-$ regions are doped with an appropriate dopant to $10^{17}$–$10^{18}$. Then, in step 1922, thin epi layer is selectively removed from gaps 204 using an appropriate photo lithographic process, leaving epi only in gaps 206. Next, in step 1924, epi growth continues, forming an $N^+PN^+$ in all gaps 204, 206. Preferably, the P-type epi layer is also 0.1–0.25 um. As a result, the epi growth on the thin epi layer in gaps 206 form the thicker $N^+$ layer 114 as in stack 104. Preferably, epi growth continues until the grown NPN stacks extend above the nitride.

Figure 6A:
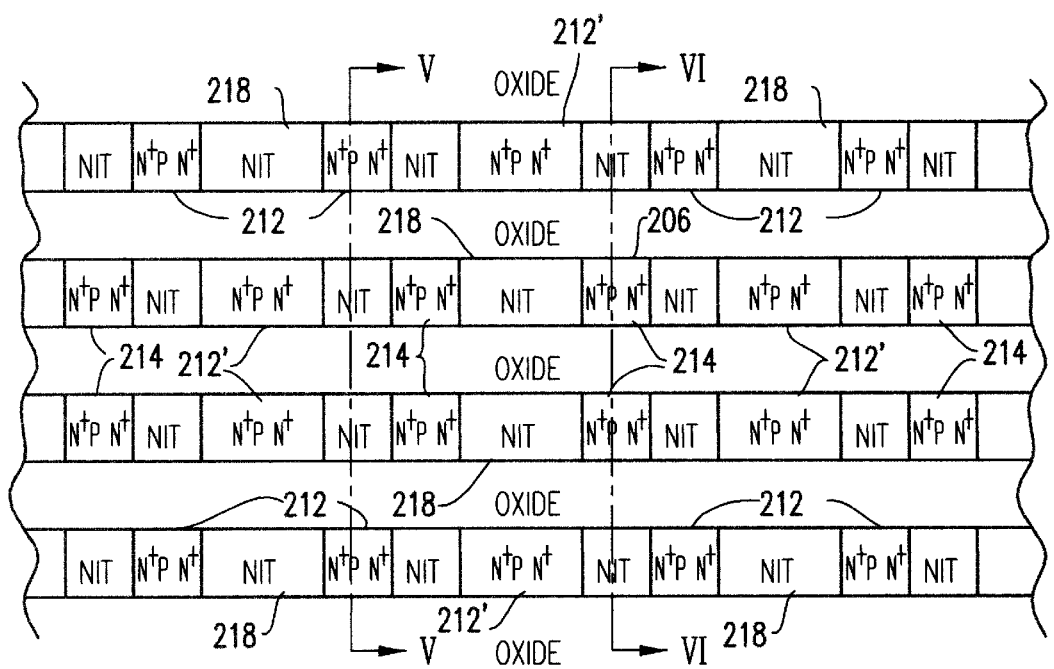
FIGS. 6A–13B are cross-sectional views illustrating the steps in the first major step of forming a latch layer according to the preferred embodiment dense SRAM cell.
Figure 6B:
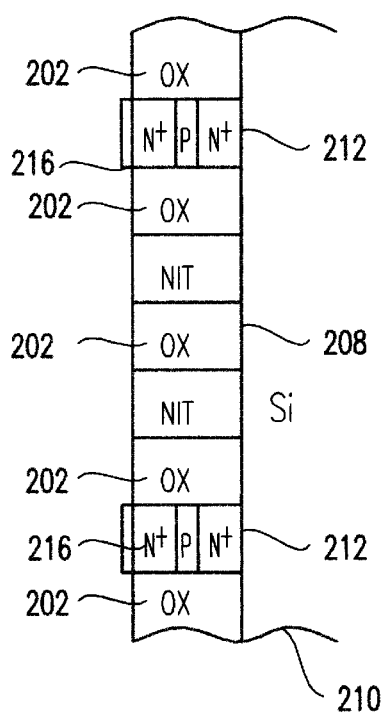
Figure 6C:
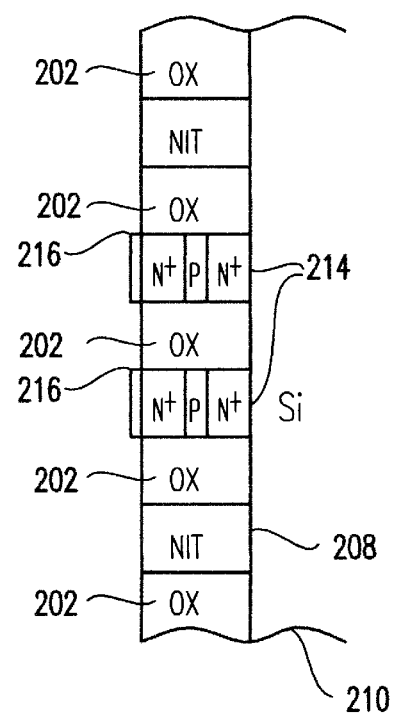

Then, in FIGS. 6A–C, an appropriate planarization technique, preferably CMP, is used to planarize the surface, thinning the epi to the top of the nitride. Thus, NPN stacks 212, having a structure similar to stack 102, are formed in gaps 204 as NPN stacks 214, which have a stack structure similar to stack 104, are completed in gaps 206. A thin oxide capping layer 216 is grown on stacks 212, 214. In a second preferred embodiment SRAM cell, a six device cell, line spaces 212' and 218 are extended sufficient to allow space for passing vertical vias through oxide layer 200, as described in more detail hereinbelow.

Figure 7:
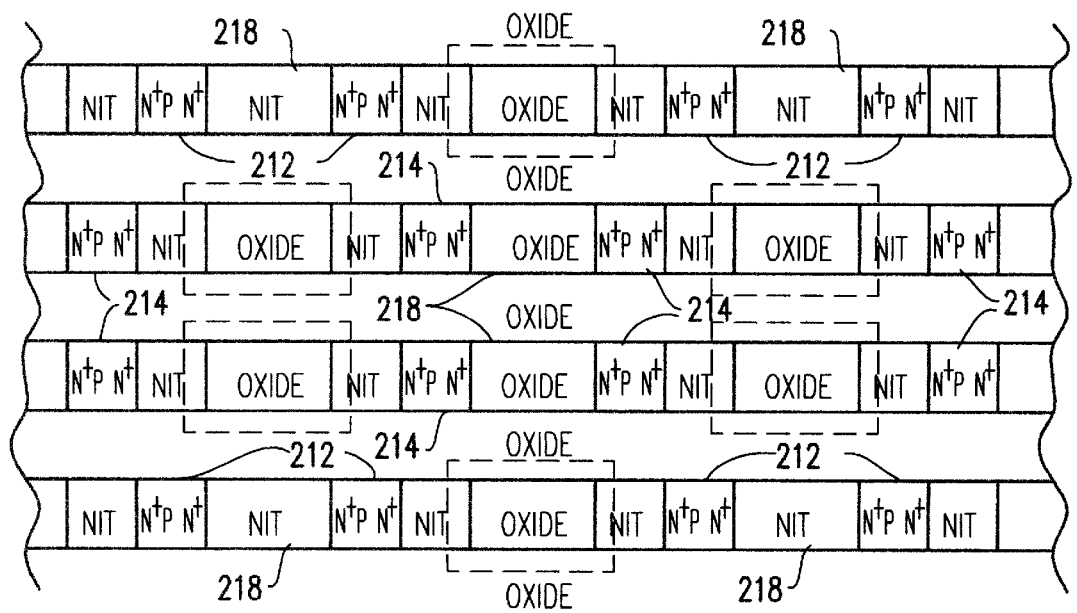

Then, in step 1926 as shown in FIG. 7, the thin oxide capping layer 216 is selectively etched from Wide NPN stacks 214. Then, the wide NPN stacks 212' are etched away to re-expose the substrate surface. Oxide, preferably TEOS, is deposited on the wafer to fill the spaces left by removal of NPN stacks 212'. An appropriate planarization process, such as CMP, is used to remove excess TEOS, planarizing the surface back down to the NPN stack 212, 214 height.

Figure 8:
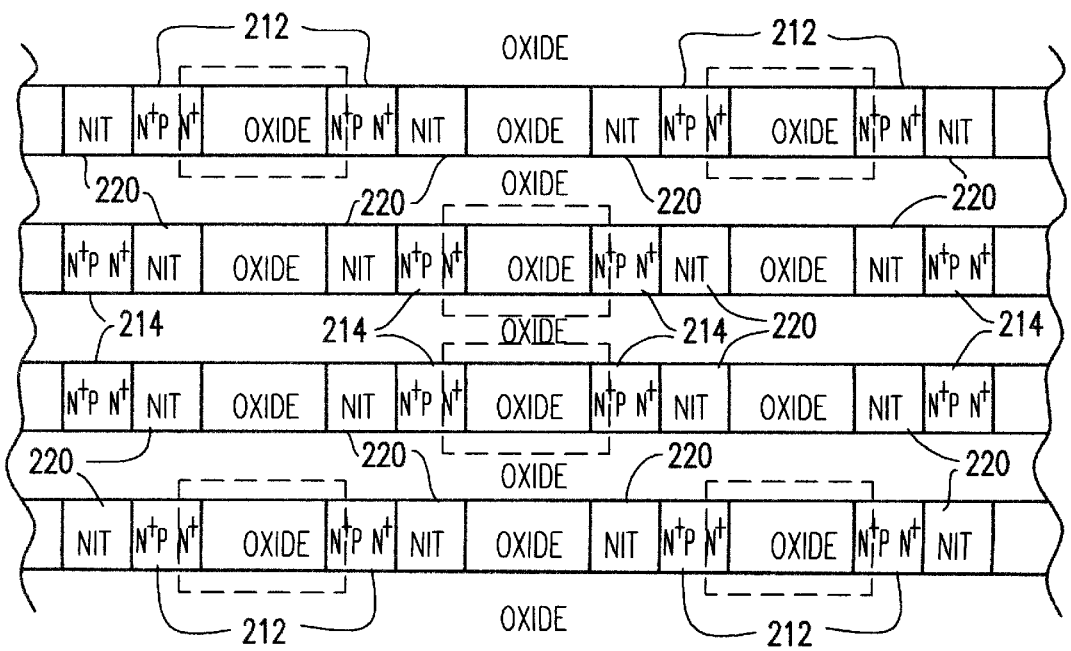

Next, in FIG. 8, the remaining wide nitride blocks 218 are selectively removed, preferably using an appropriate photo lithographic mask and etch removal technique. Then, as in FIG. 7, oxide, preferably TEOS, is deposited on the wafer to fill the spaces left by removal of wide nitride blocks 218. An appropriate planarization process, such as CMP, is used to remove excess TEOS, planarizing the surface back down to the NPN stack 212, 214 height.

Figure 1B:
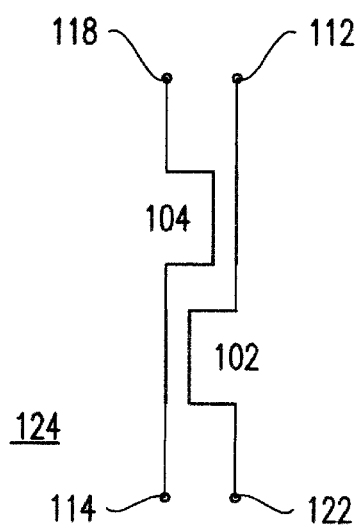
Figure 1C:
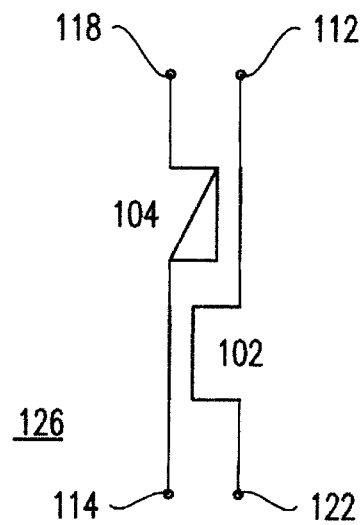

For the present example, as represented in FIGS. 3A–C, the latches are formed from two cross-coupled NFET/PFET pairs, such as pair 126 in FIG. 1C. So, in step 1928, the remaining nitride 220 is etched away to expose the channel surface on the sidewalls of NPN stacks 212, 214. Optional step 1930 may be done at this point, wherein the exposed sidewall of the channel layer (120 in FIG. 1), the NFET channel surface, may be more lightly P-doped than the rest of the P-type epi layer to form a surface channel layer, improving NFET performance.

In this optional step 1930, channel surface doping concentration is modified by subjecting the exposed bare P-type epi layer to a gaseous N-type dopant source such as arsene or phosphene. The gas permeates the exposed sidewall with no effect on the source and drain epi layers and forming a shallow sidewall surface layer in the p-type channel epi layer. Once the adjacent P+ epi layer that forms the gate is formed, the threshold voltage of the resulting buried channel NFET is reduced over that of a typical NFET in a preferred direct coupled NFET/PFET pair 126.

Figure 9:
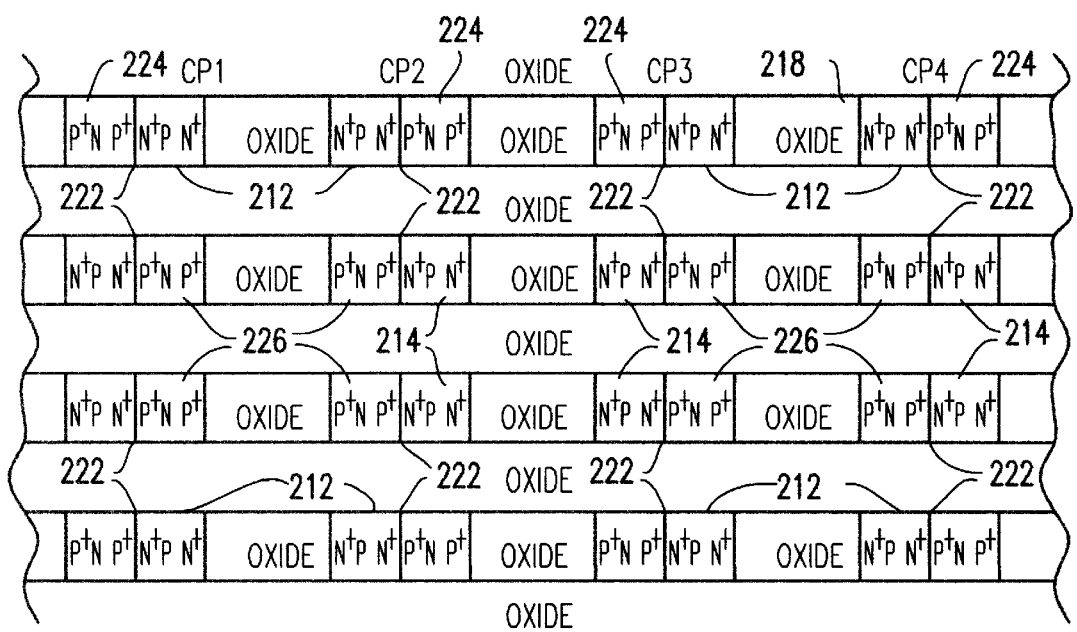

Next, in step 1932 as represented in FIG. 9, after exposing the sidewalls and, after the above optional step of forming the buried NFET channel if included, gate oxide 222 is grown on the sidewalls and, coincidentally, on the exposed silicon surface in the open areas 220. A thin conformal nitride layer (not shown) is deposited on the gate oxide 222. The nitride is directionally etched, preferably using Reactive Ion Etching (RIE), to re-expose gate oxide 222 on horizontal surfaces such as the substrate in openings 220. The exposed gate oxide 222 is removed using a non-ionizing chemical dry etch (CDE). Then, the remaining nitride is removed, re-exposing the gate oxide 222 along the sidewalls of the vertical NPN stacks 212, 214 (especially on the channel). Thus, the wafer is ready for PNP stack 224, 226 formation, which progresses in steps 1934, 1936 and 1938, essentially identically to NPN stack formation.

As with NPN stacks 212, 214, in step 1934, a thin P+ doped epitaxial layer (not shown) is grown in the spaces 220 on the exposed silicon, preferably, 0.1 um thick. Then, in step 1936, the thin epi layer is selectively removed from openings 226 using an appropriate photo lithographic process, leaving epi only in openings 224. Next, in step 1938, epi growth continues, forming an P+ NP+ in all openings 224, 226. Preferably, the N-type epi layer is also 0.1–0.25 um. As a result, the epi growth on the thin P+ epi layer in openings 224 form the thicker P+ layer 114 as in stack 104. Preferably, epi growth continues until the grown PNP stacks 224, 226 extend above the wafer's surface. Then, as in FIGS. 6A–C, an appropriate planarization technique, preferably CMP, is used to planarize the surface. Thus, PNP stacks 226, having a structure similar to stack 102, are formed in openings adjacent to NPN stacks 212 coincident with forming PNP stacks 224, having a stack structure similar to stack 104, in openings adjacent to stacks 214. For convenience in relating subsequent figures to FIG. 9, the four columns of directly coupled FET pairs in FIG. 9 are labeled CP1, CP2, CP3 and CP4.

Figure 4D:
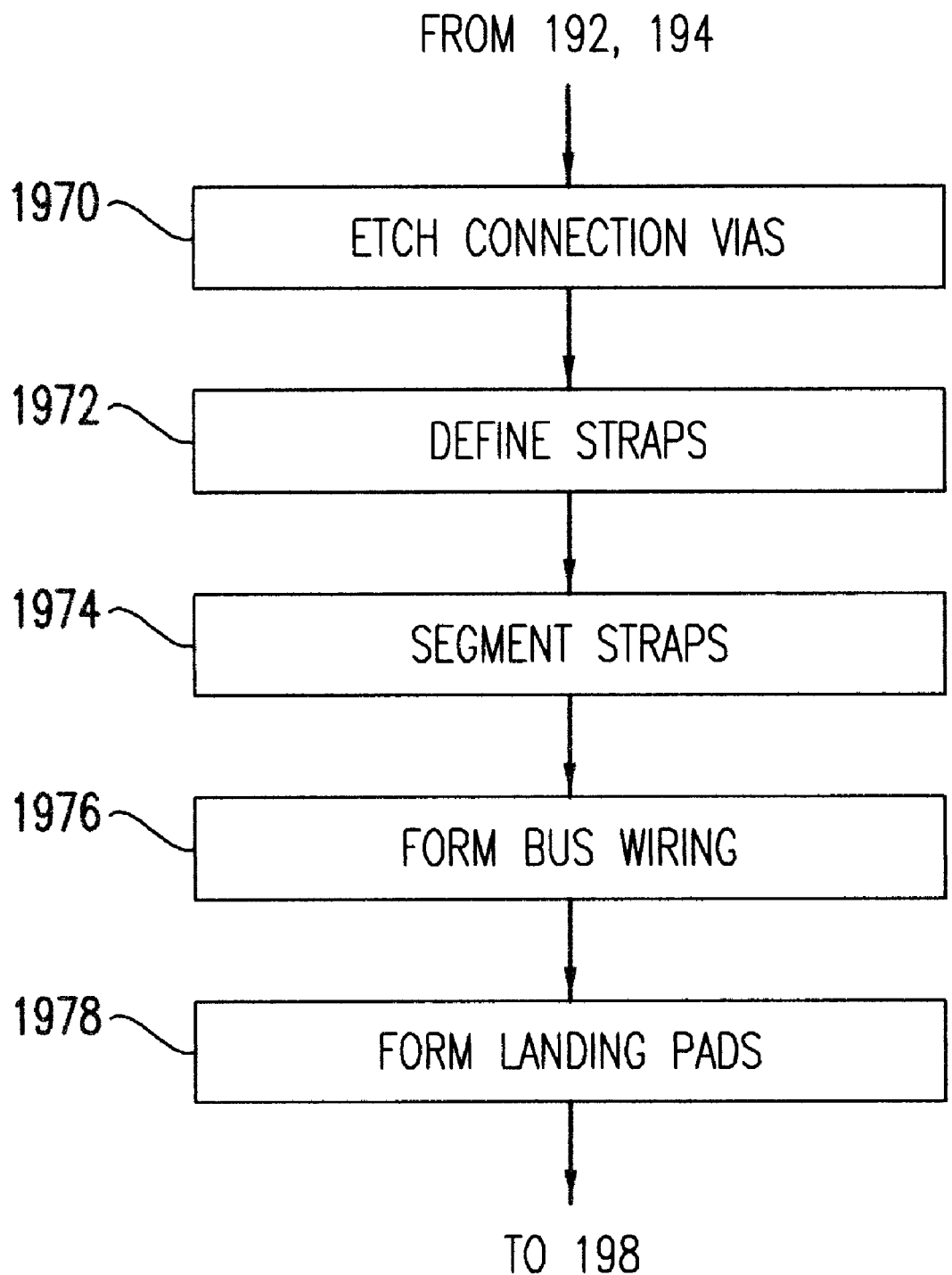
Figure 4E:
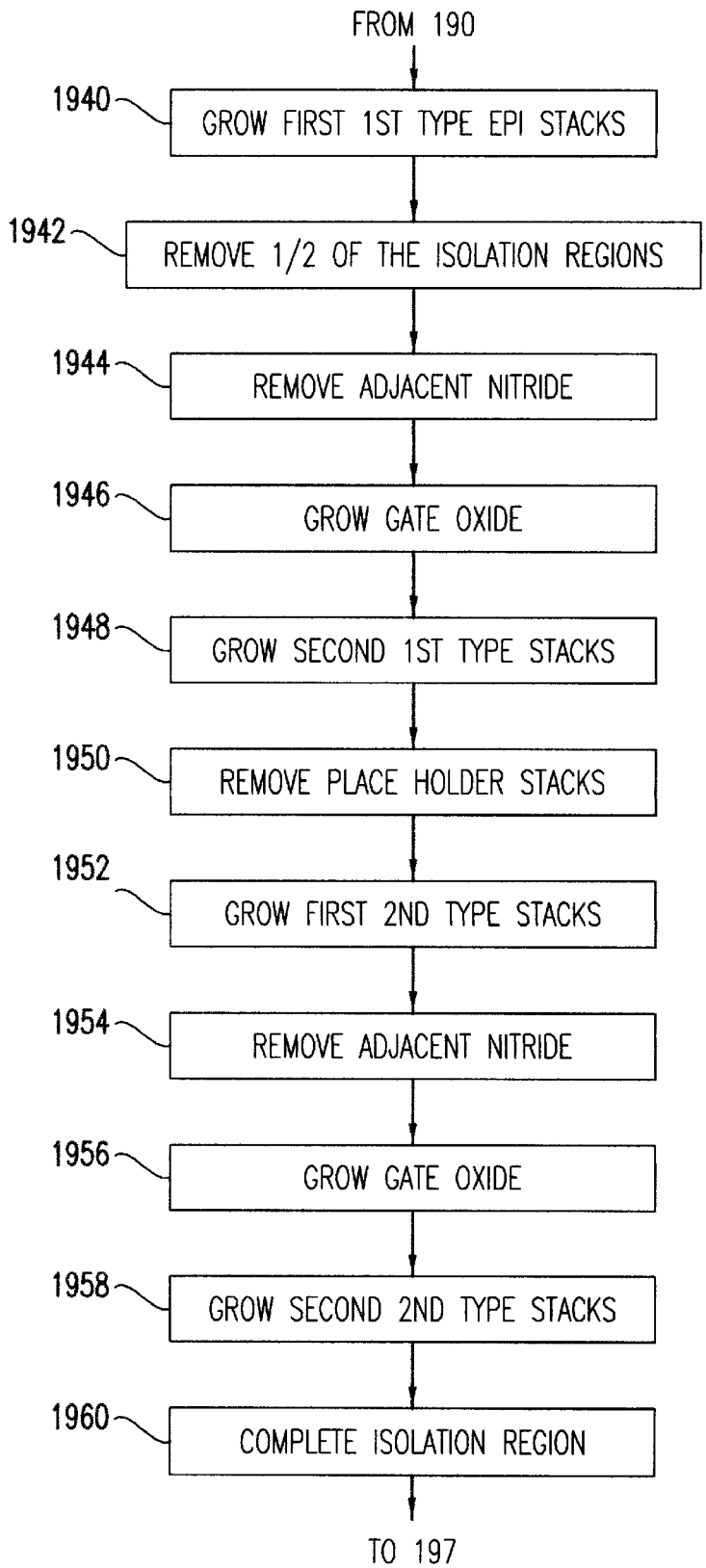
Figure 10A:
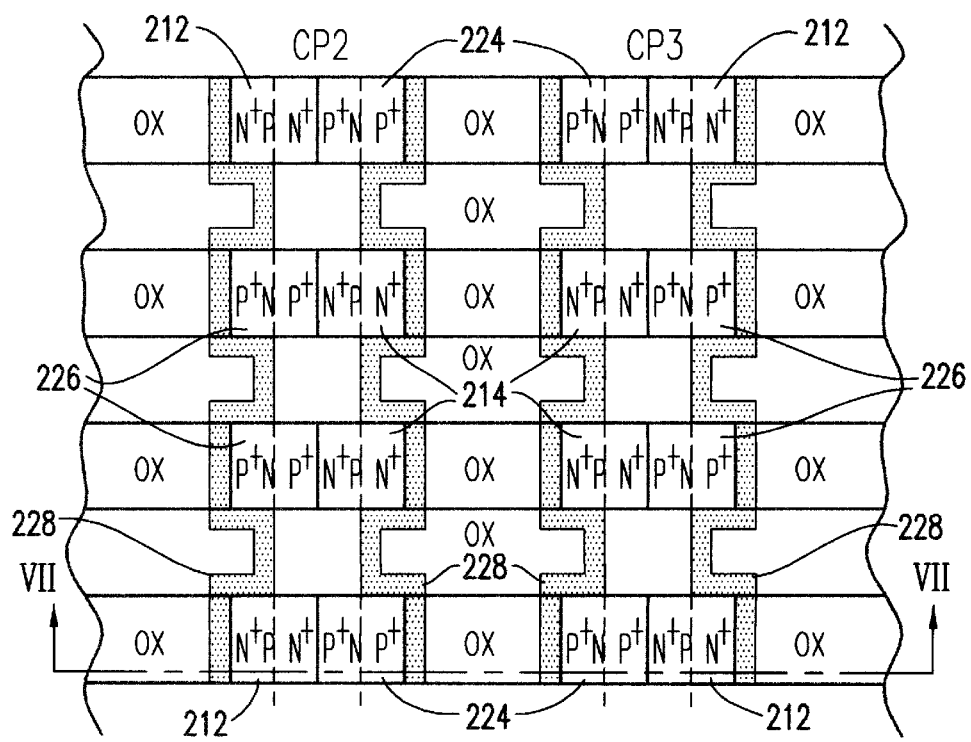
Figure 10B:
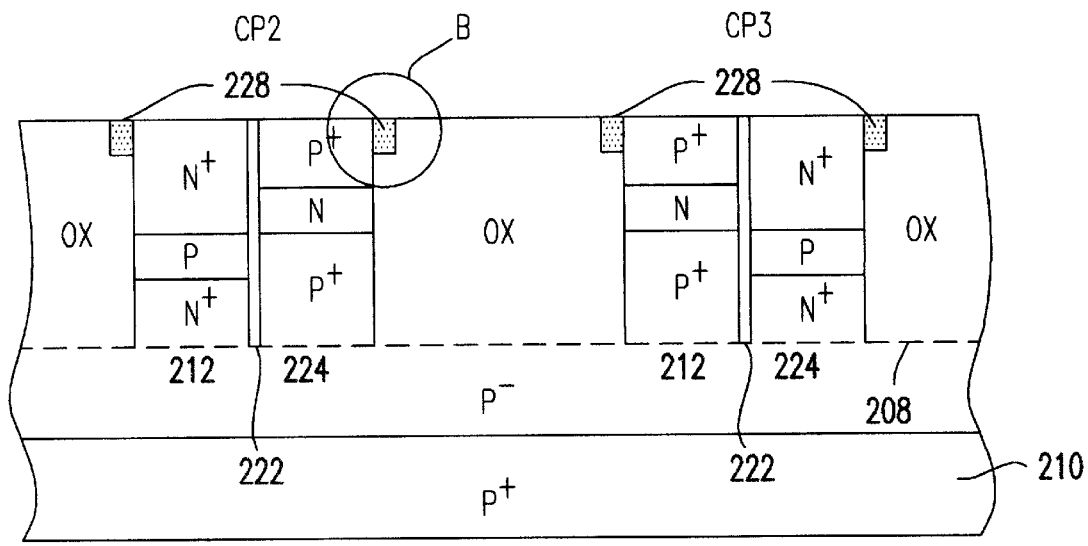
Figure 10C:
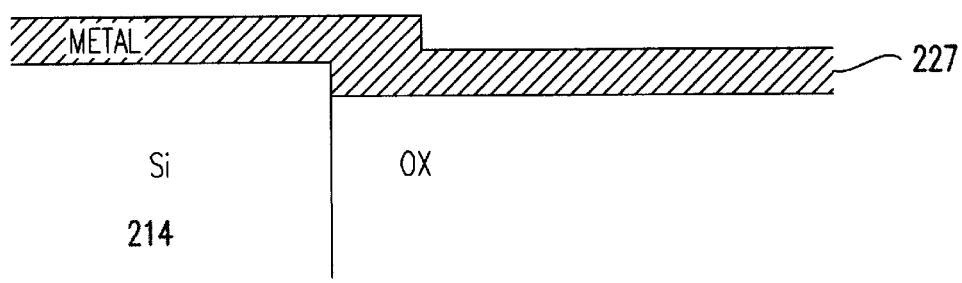
Figure 10D:
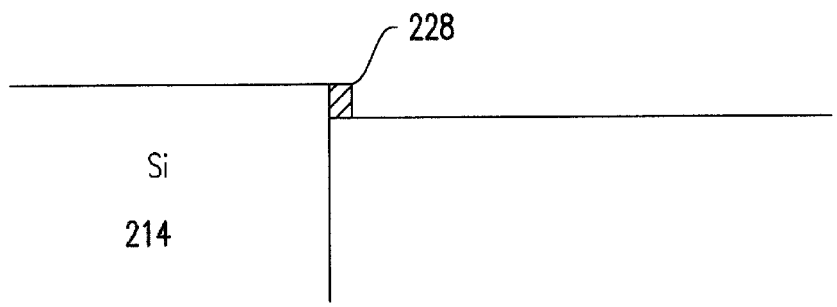
Figure 10E:
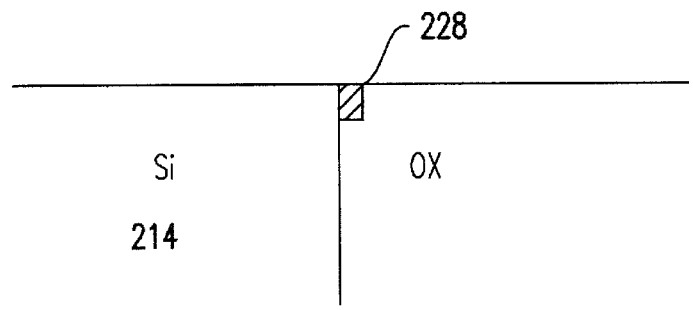

Having formed the directly coupled vertical FET pairs 212, 224 and 214, 226, in step 197 the pairs may be wired together into latches in FIG. 4D. Thus, in step 1970 as represented by FIGS. 10A–E, a protective mask, represented by the dotted lines in FIG. 10A, is formed over the gate oxide 222. Exposed oxide is selectively etched along the perimeter of device source/drains to recess the oxide. FIG. 10A is an expansion of the area of FIG. 9 at columns CP2-3. FIG. 10B represents the section of FIG. 10 through section line VII. FIGS. 10C–E represent formation of the latch wiring in for example area B of FIG. 10B.

First, in step 1972, strap metal, preferably tungsten, is deposited on the surface as represented by 227 in FIG. 10C. Surface strap metal layer is etched away, preferably using RIE, leaving lines 228 strapping numerous latches together. The mask is removed and an oxide layer, preferably TEOS, is deposited on the surface. Then, the TEOS surface is planarized, preferably using CMP, and TEOS is removed to re-expose the tops of the stacks 212, 224 and 214, 226.

Figure 11:
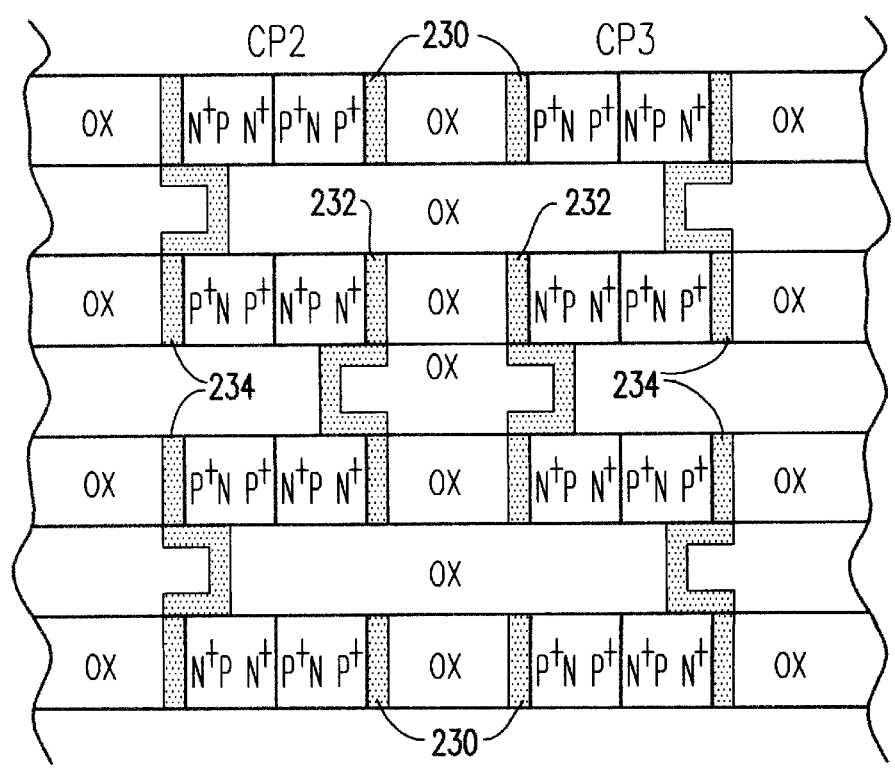

In step 1974 as represented in FIG. 11, segments of the lines 228 are removed to isolate the latches, and in particular to separate $V_h$ lines 230 and ground lines 232. Lines 234 are latch wiring. Once the supply and ground lines 230, 232 are separated and the latch wiring lines 234 are defined in step 1974, the areas opened to remove the metal wire segments are filled with TEOS and the surface is planarized, preferably, using CMP.

To re-iterate, the minimum or subminimum dimension sidewall contact/conductor 228 of FIG. 10B can be to silicon (or other conductor) as shown in FIG. 10C, D, E. FIG. 10C shows the edge of a silicon region with an adjacent insulator, with the insulator (SiO2, TEOS, SiN, etc.) surface at a level below the silicon surface. A metallic layer 227 is deposited such that the thickness of layer 227 is approximately equal to the thickness of step 229. Directional ion etching is used to remove the metallic layer 227 (the metallic layer may be Aluminum, Al—Cu, Copper, Tungsten, Titanium, Nickel, etc., or it may be a composite such as a layer of Ti below a layer of Aluminum for enhanced contact reliability) leaving conductive region 228 shown in FIG. 10D. Insulating material (such as TEOS) is then deposited and planarized using CMP to produce the structure of FIG. 10E. Conductor 228 contacts the silicon and is also used for wiring to other structures.

Figure 12A:
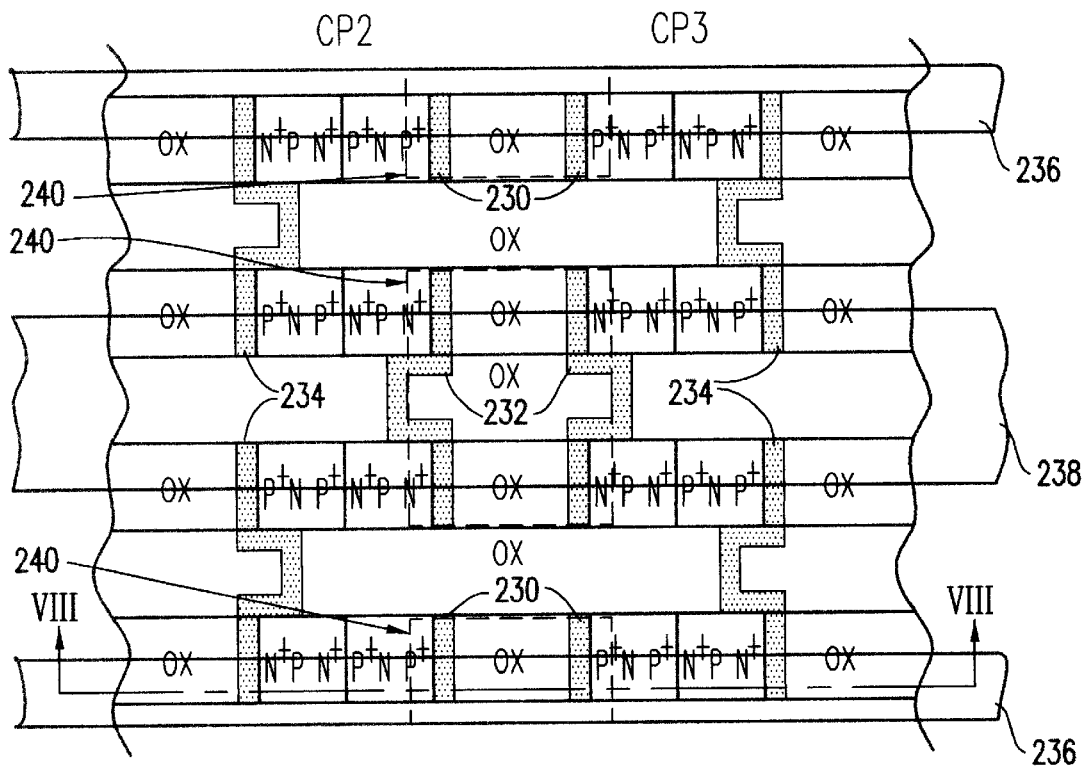
Figure 12B:
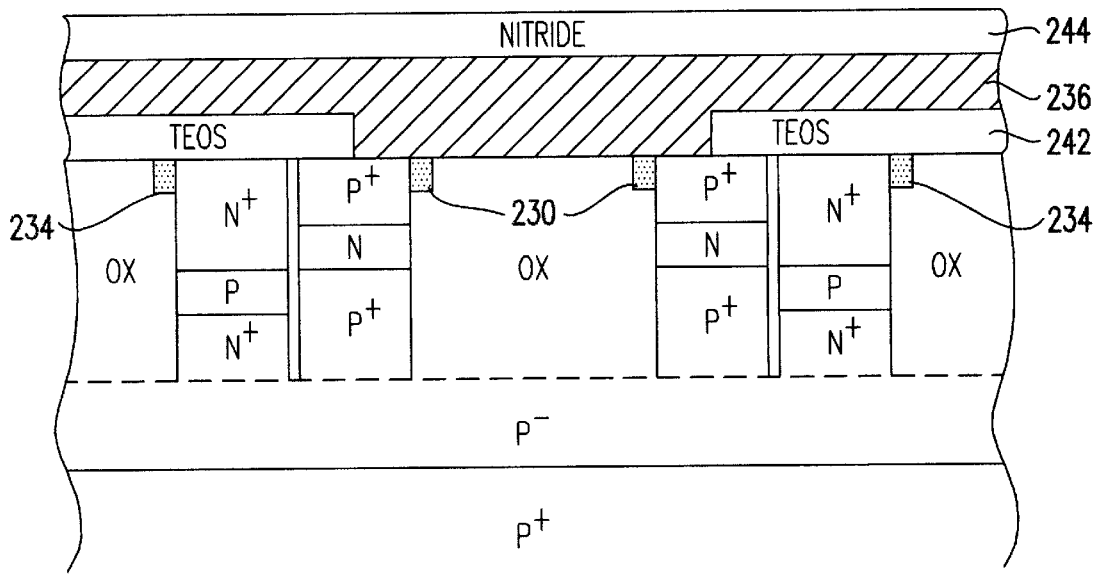

In step 1976 as represented in FIG. 12A–B, power supply bus wiring 236, and ground bus wiring 238 is formed. FIG. 12B is a cross section of FIG. 12A through section line VIII. First, large contact areas 240 are opened through the previously formed TEOS surface layer 242 to the latch supply wiring 230, 232 therebelow. Next, a layer of a suitable metal, preferably tungsten, is deposited and capped with a layer of nitride 244. Then, the bus metal is patterned, preferably by etching, to form power and ground supply bus lines 236, 238. Nitride spacers are formed along the edges of the bus wires 236, 238.

Figure 13A:
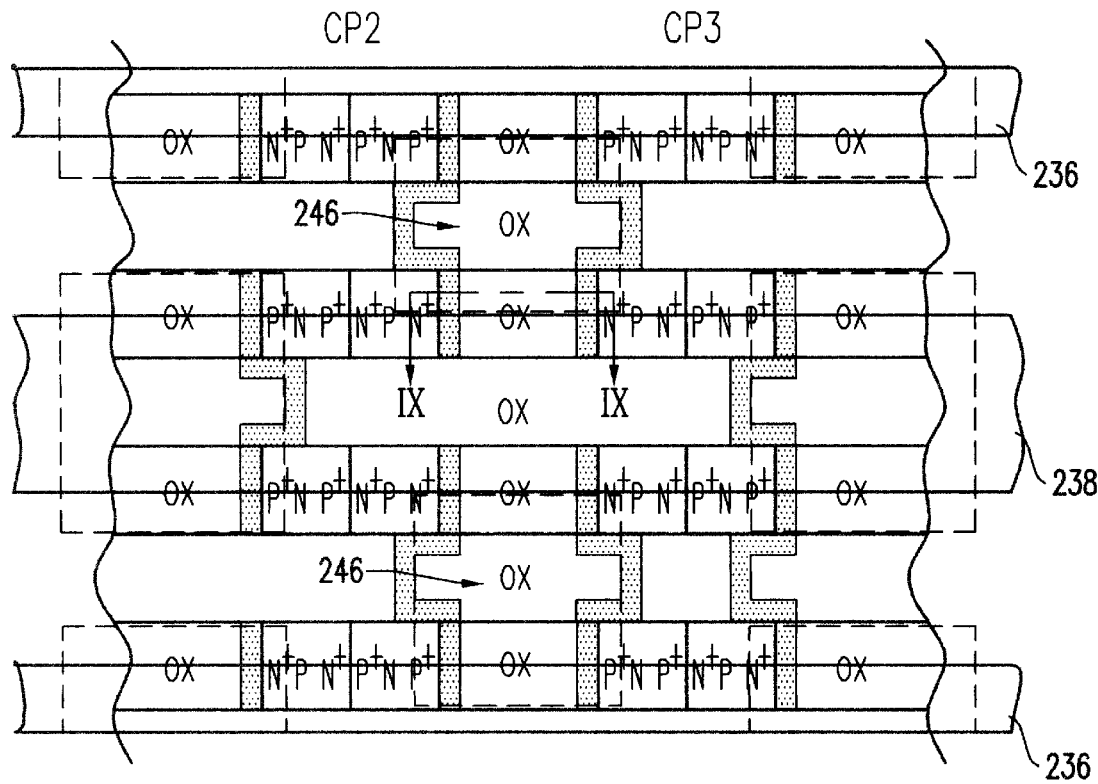
Figure 13B:
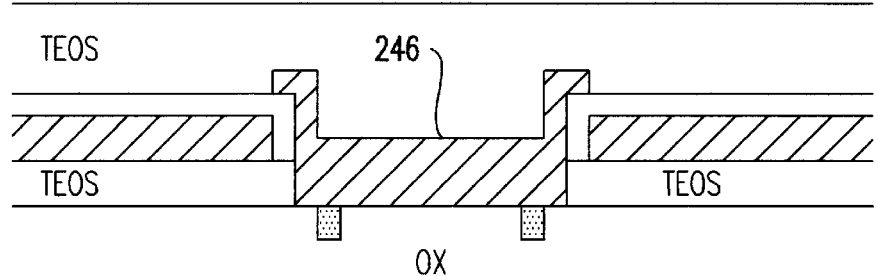

The final step, step 1978, in this first major step is formation of latch landing pads 246 as represented in FIGS. 13A–B. FIG. 13B is a jog cut through section line IX in FIG. 13A. The latch landing pads 246 are for subsequent connection to latch wiring 234 and, temporarily, short latches in adjacent columns together. The latch landing pads 246 are formed by opening the TEOS layer over the latch wiring 234 between supply power and ground bus wires 236, 238, preferably using RIE that is selective to nitride. Next, a conductive material, preferably a metal, is deposited and patterned, preferably using an appropriate etchant, to form landing pads 246. Finally TEOS 248 is deposited and planarized, preferably using a suitable CMP.

Figure 14:
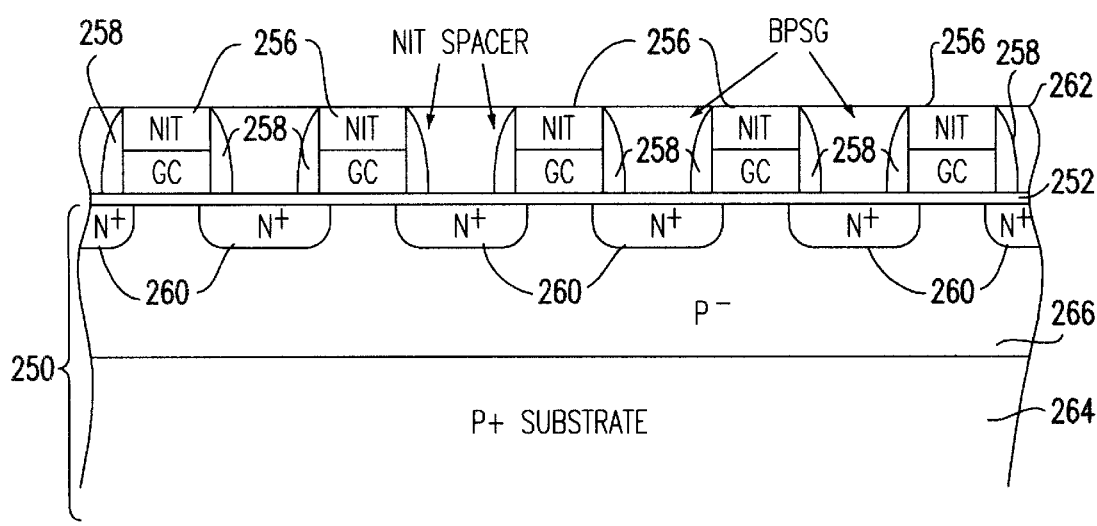
FIG. 14 is a cross-sectional view illustrating the second major step of forming a cell pass gates layer.

Proceeding to the next major step 198 as represented in FIG. 14, a layer containing the cell pass gates may be formed. In this second major step 198 NFET pass gates are formed on a semiconductor wafer, preferably a silicon wafer 250, using an appropriate process.

Preferably, the wafer 250 is P$^-$/P$^+$ doped. After implanting the wafer to tailor device thresholds, i.e. V$_t$ tailoring, gate oxide 252 is formed on the P$^{31}$ surface 254. A gate conductor layer is formed on the gate oxide layer and a nitride layer is formed on the gate conductor layer. Gates 256 are formed from the gate conductor layer and nitride layer. Nitride spacers 258 are formed along the gate sidewalls. Gate diffusions 260 are implanted between the gates 256. the surface is covered with an insulating material, e.g., boro-phospho-silica glass (BPSG), and planarized to surface 262.

Having formed the pass gates, second major step 198 is complete and the wafer 250 may be prepared for mounting on a latch layer. A handle wafer is bonded to surface 262, using an appropriate temporary bonding material or adhesive. The temporary adhesive may be a thermoplastic material (e.g., Ditac marketed by Dupont) that is capable of withstanding subsequent wafer processing steps, while remaining removable to allow removing the handle wafer.

Thus, using an appropriate bond and etchback technique such as CMP, the P$^+$ layer 264 is removed from the wafer 250, leaving only the P$^-$ layer 266 on which the pass gates have been formed. Next, a TEOS layer is formed on the P$^-$ layer 266.

Finally, a bonding layer, preferably of acetylene-terminated isoimide oligomers containing benzophenonete-tetracarboxylic dianhydride with 1,3-bis (3-amino-phenoxy) benzene backbone units, such as Thermid, is deposited on the TEOS layer for bonding to the top surface of a latch wafer's TEOS layer.

In the third major step 199, the pass gate layer is bonded to the latch layer and interconnected the two layers. so, FIG. 15a is cross section of a latch wafer 270 through an area between devices as in FIG. 13A with a pass gate wafer 272, prepared as described above with reference to FIG. 14, mounted to the latch wafer's top surface 274. As described above, the handle wafer 276 is attached to the pass gate wafer by an easily removable bonding layer 278. The bonding layer is attached to an optional oxide layer 280 on the handle wafer 276. TEOS layer 282 on the opposite surface of pass gate wafer 272 is attached to the latch wafer 270 by bonding layer 284. Having mounted the pass gate wafer 272 on the latch wafer 270, the substrate, P$^+$ and P$^-$ layers 286, 288 are removed from the latch wafer 270. First, as described above, for removing the substrate layer from the pass gate layer 272, the P$^+$ layer 286 is polished away to the P$^-$ layer 288 using an appropriate technique, such as CMP. Then, the exposed P$^-$ layer 288 is etched away until SiO$_2$ bi-products are detected, which indicates that isolation oxide 290 is exposed at surface 292 and etching stops.

On this newly exposed surface, as described above with reference to FIGS. 10A–B, 11 and 12A–B, latch wiring is completed: forming lines strapping devices together as in FIGS. 10A–B; supply, ground and wiring lines as in FIG. 11; and forming busses as in FIGS. 12A–B. It should be noted that the busses formed on surface 292 are offset from the busses 236, 238 formed at the opposite ends of the stacks in FIGS. 12A–B, such that a supply bus line 236 is always opposite a ground bus line 296 and vice versa. The resulting capacitance from this supply/ground bus arrangement affords additional noise decoupling, adding array noise stability.

Figure 16:
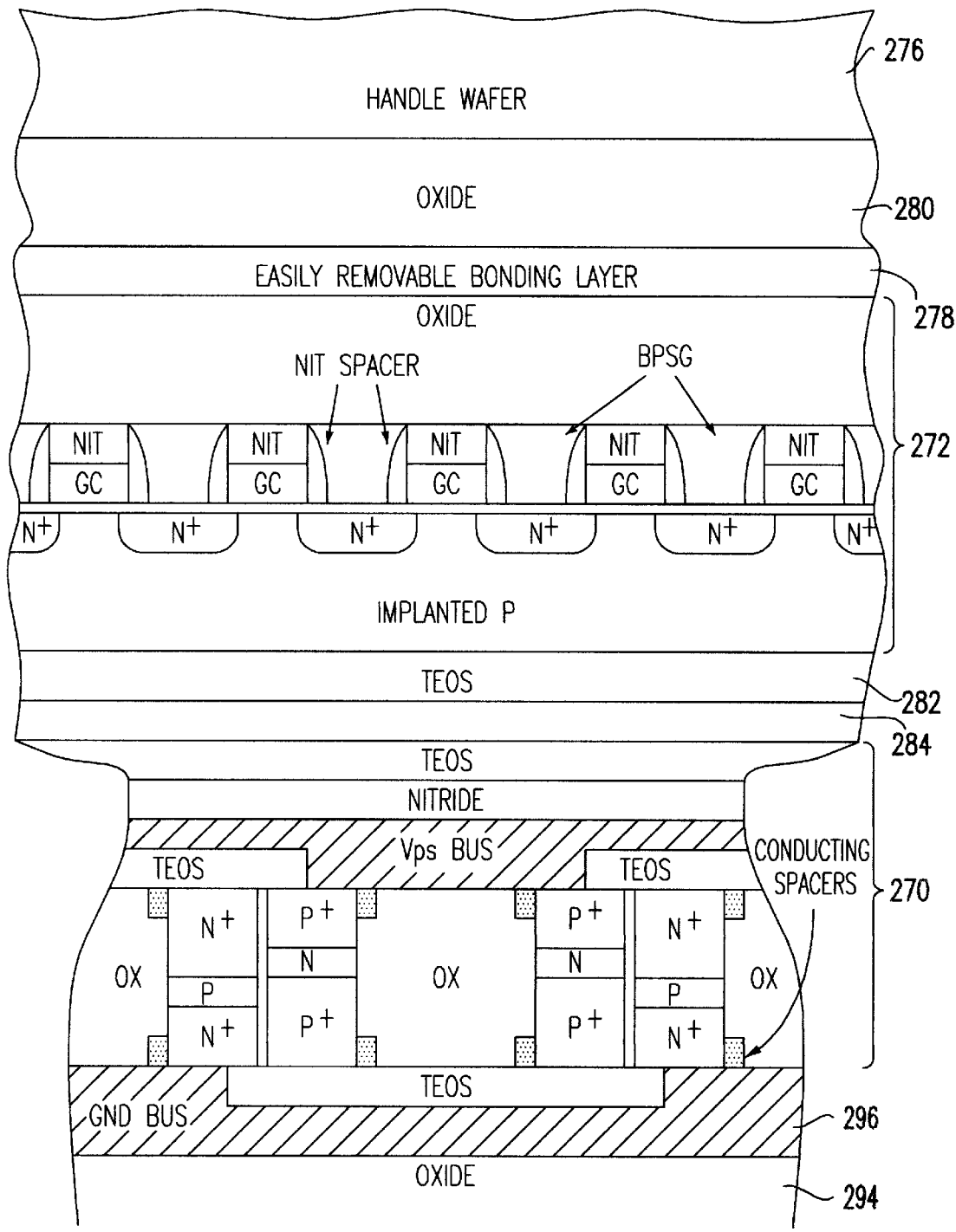

Then, in FIG. 16, a passivating oxide layer 294 is formed over the busses 296. FIG. 16 is a cross section of a pass gate wafer 272 attached to a latch wafer 270 through an area as in FIG. 12A after forming the busses. Having completed latch wiring, all that is left to complete the SRAM cell is to connect the pass gates to the latches.

Figure 15:
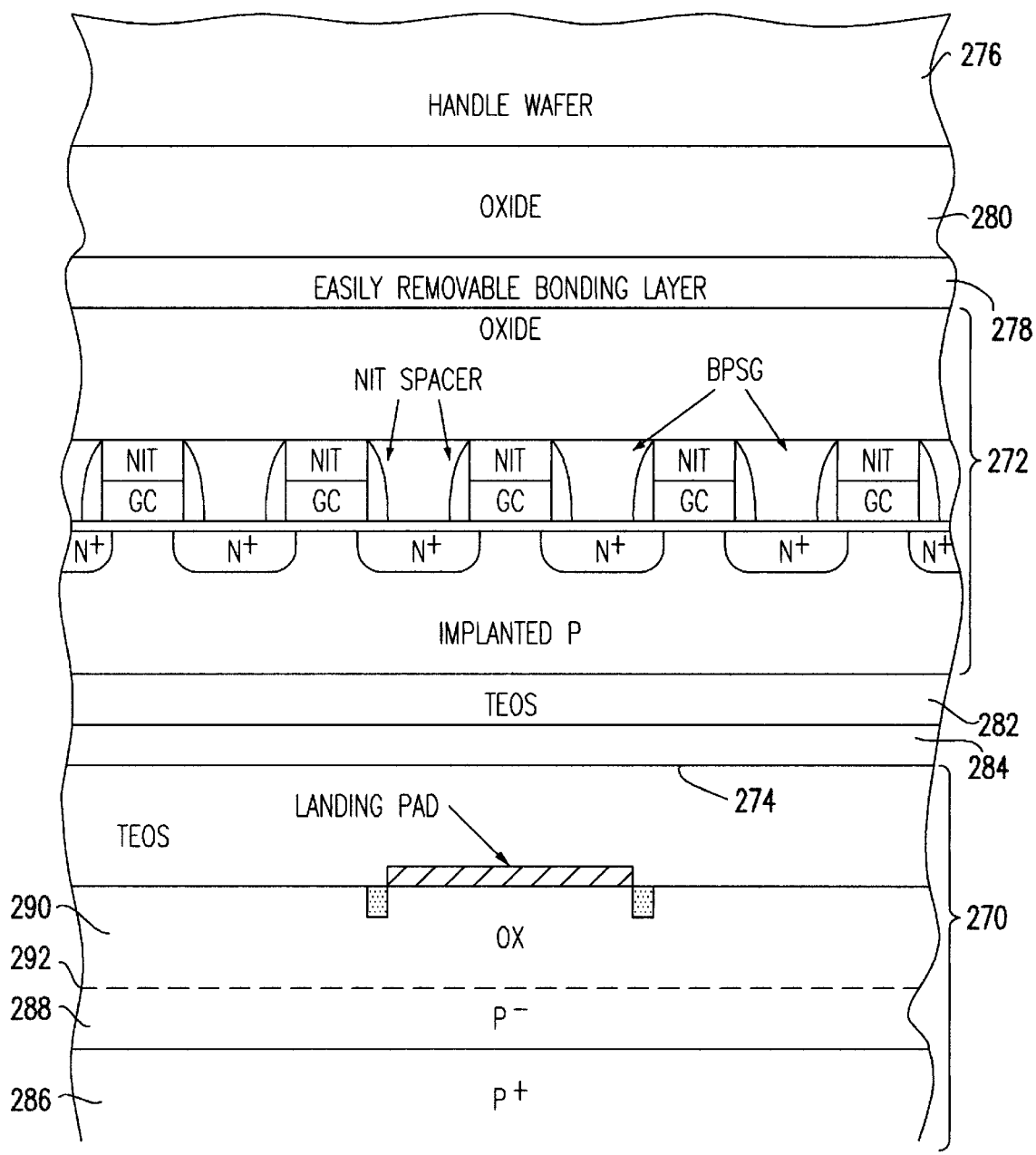
FIGS. 15–20 are cross-sectional views illustrating the steps in the third major step of bonding and interconnecting the latch layer to the pass gate layer according to the preferred embodiment of the present invention.
Figure 17:
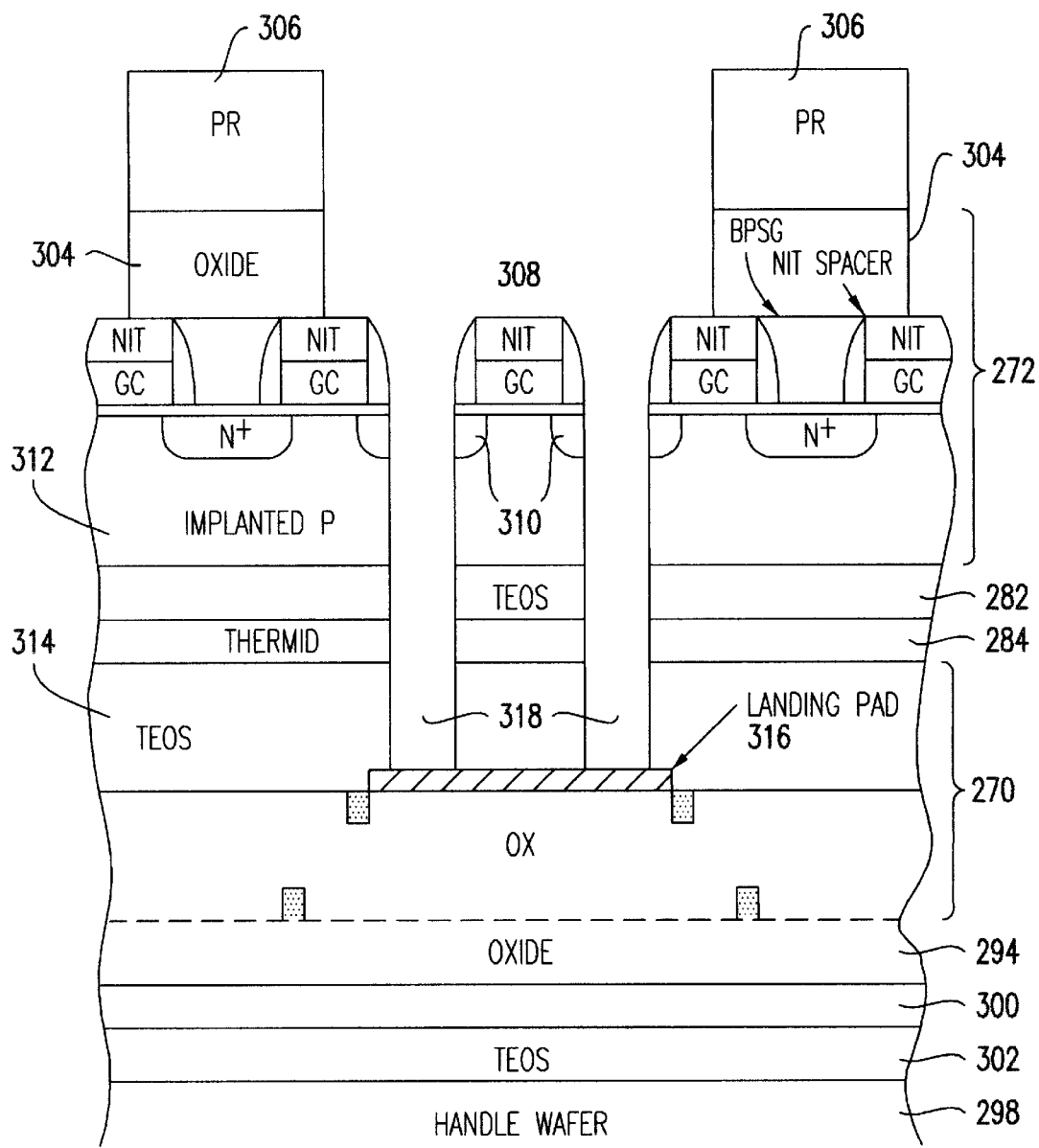

Thus, in FIG. 17, which corresponds to the cross section of FIG. 15, a handle layer 298 is attached to the passivating oxide layer 294 in a manner similar to that used for bonding layer 278. In this example, a bonding layer 300 attaches a TEOS layer 302 on the handle layer 298 to the passivating layer 294. Then, the bond of the first bonding layer 278 is broken to remove the first handle wafer 276 and its associated oxide layer 280.

After removing the first handle layer 276, if desired, the exposed oxide layer 304 may be thinned. A mask 306 is applied to define vertical contact areas 308, where contact is made between the pass gates and latches therebelow. First, oxide layer 304 is removed in areas 308, exposing BPSG between gates. The BPSG is removed, exposing the gate oxide layer over the diffusions, which is also removed to expose the doped silicon of the pass gate source/drain diffusions 310. Preferably, the oxide 304, BPSG and gate oxide layer are etched away using an appropriate RIE. Etching continues, preferably using an appropriate RIE, through diffusion 310, P$^-$ bulk layer 312, TEOS layer 282, bonding layer 284 and the latch wafer's surface TEOS layer 314 to landing pad 316. After etching is complete, vertical paths 318 have been opened between pass gate diffusions 310 and the shared landing pads 316.

Figure 18:
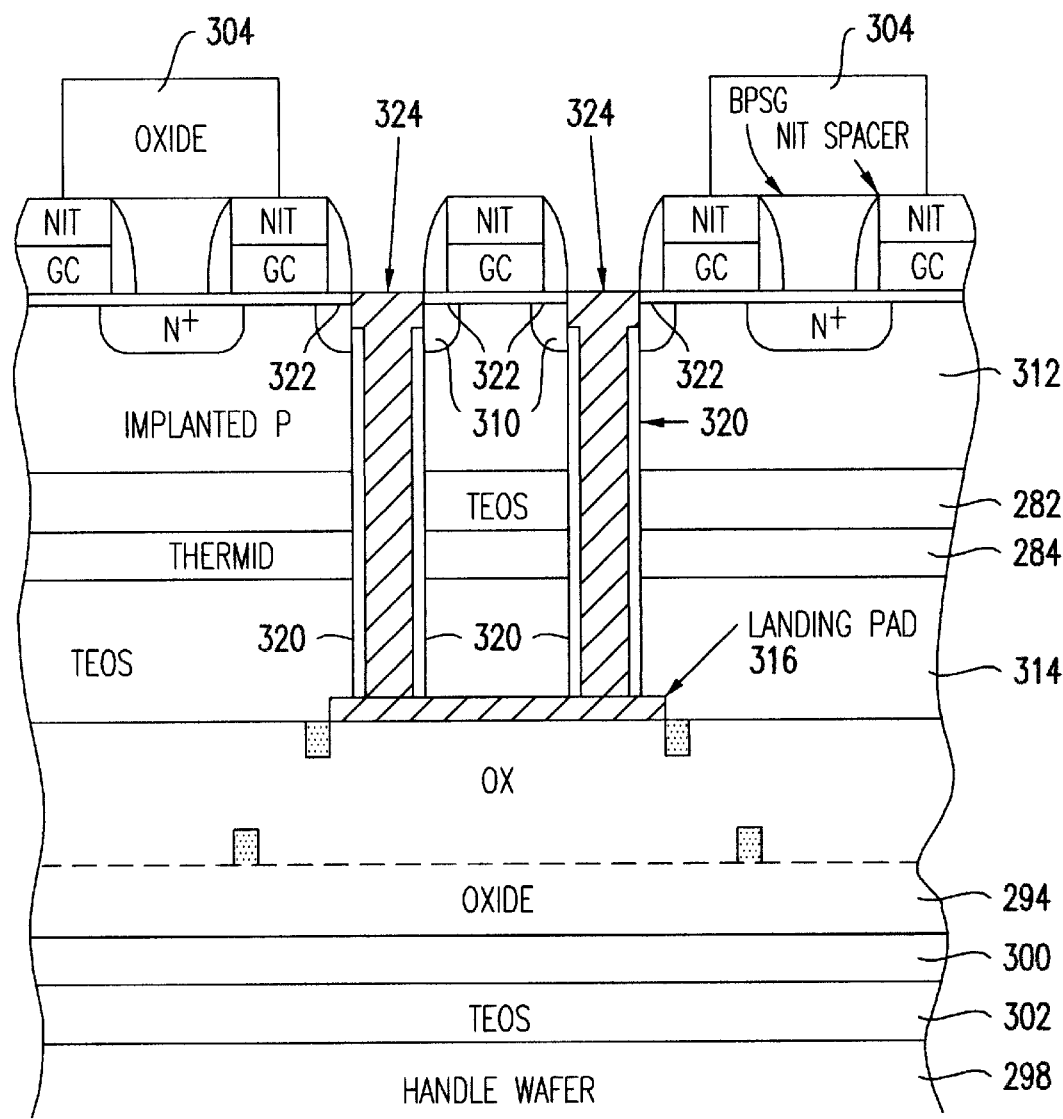

Next, in FIG. 18, after removing the mask 306, a thin nitride layer is conformally deposited on the surface and into the paths 318. Horizontal nitride is removed, preferably using RIE, leaving nitride liners 320 in vertical paths 318. Diffusion 310 sidewall contacts are formed by recessing the sidewall liner 320 slightly below surface 322 of diffusions 310. So, the liners 320 are filled with a suitable material, such as a photo resist, which is then recessed below surface 322 to expose the upper perimeter of the liner 320. The exposed liner 320 is etched away to open the sidewall contact and the photo resist is removed. Having opened the sidewall contacts to diffusions 310, conducting material, preferably metal, is deposited sufficient at least to fill the paths 318 to the surface 322, forming a connection 324 between the landing pads 316 and pass gate diffusions 310. If the metal 324 extends above surface 322, it may be etched down to surface 322 to minimize pass gate to drain capacitance.

Figure 19:
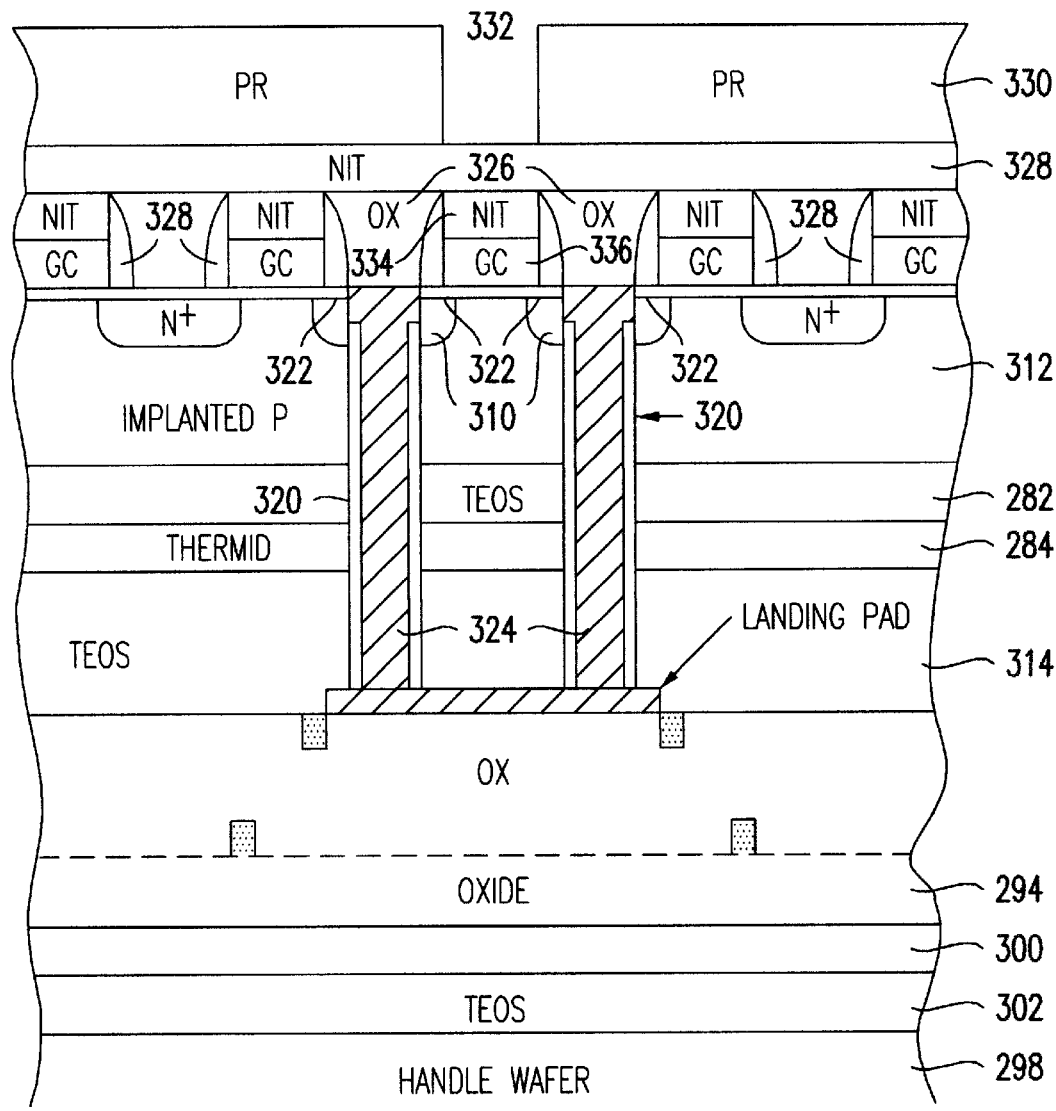

Next, in FIG. 19, the spaces above conducting paths 324 are filled with oxide 326, preferably TEOS, and the surface is planarized down to the nitride caps 328 on the gates. A thin nitride layer 328 is deposited on the planar surface.

Next, landing pads 316 are split to separate the two latches sharing each landing pad 316. A mask layer 330 is applied to open an area 332 for defining a trench between conducting paths 324. The exposed nitride layer is opened to nitride cap 334. Nitride cap 334 is remove to expose gate conductor 336. Gate conductor 336 is removed, exposing gate oxide therebelow. These three layers 328, 334 and 336 are removed, preferably using RIE. Next, gate oxide is opened in area 332 and mask layer 330 is removed.

Figure 20:
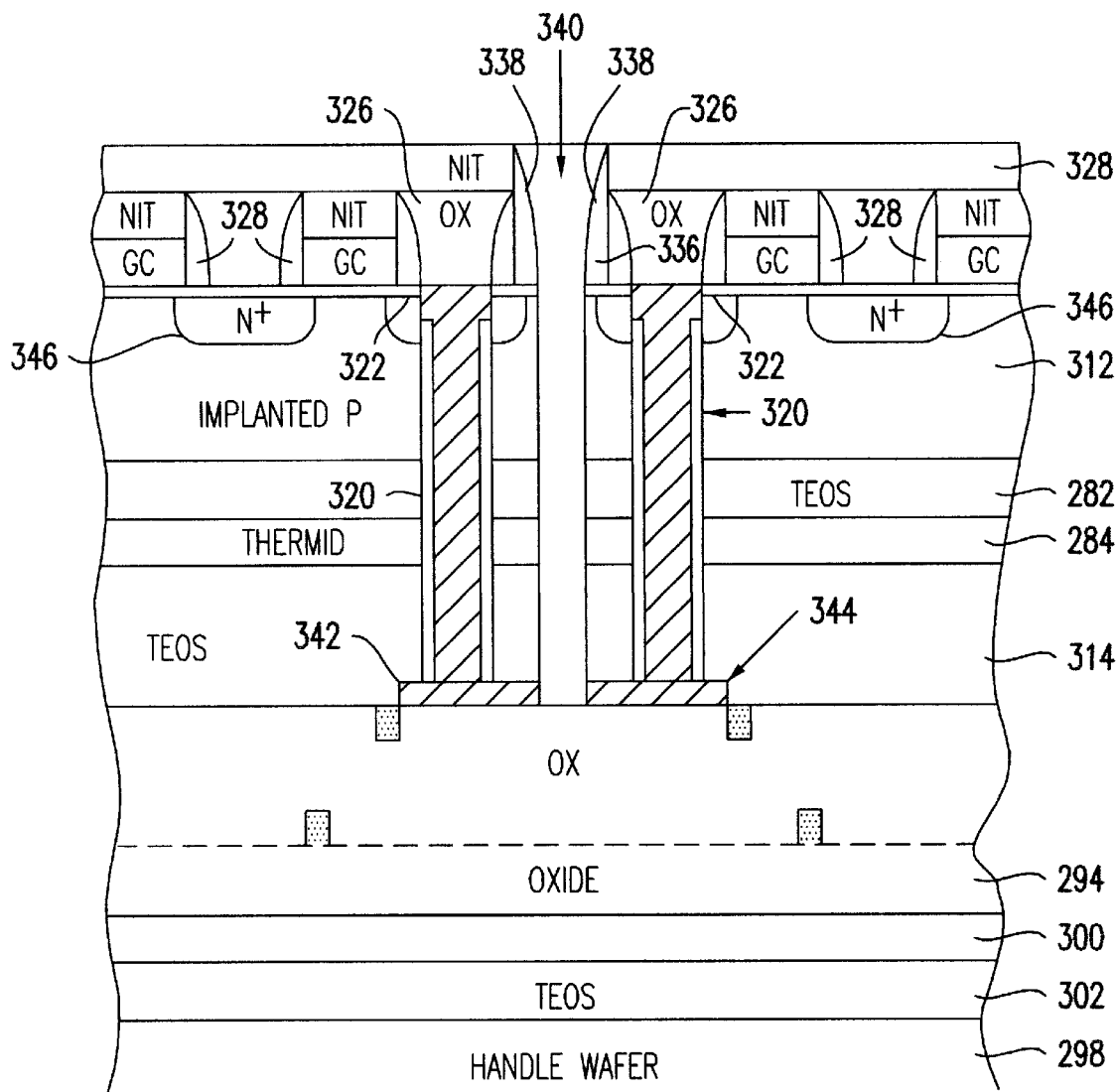

In FIG. 20, nitride spacers 338 are formed along the sidewalls of the open area 332. These spacers 338 prevent inadvertent exposure of conducting paths 324 that might otherwise result from misalignment. Then, using substantially the same technique as used to open paths 318, the trench is 340 is opened through the remaining layers down to the landing pad 316. Then, preferably using RIE, the landing pad 316 is etched to split it. Thus, the two latches sharing the pad 316 are separated, each with one half pad 342, 344. The trenches 340 are filled with insulating material, preferably TEOS, and the surface is planarized using CMP.

Finally, bit line contacts are opened to bit line diffusions 346 and bit lines are formed on the nitride surface using an appropriate process. Thus, having formed the SRAM array, the wafer is completed using appropriate steps of a conventional IC chip manufacturing process.

The second preferred embodiment SRAM is a six device SRAM cell. The second preferred embodiment is formed using the same three major steps 190, 192, 197, 198 and 199 as in the first preferred embodiment SRAM cell, with minor variations in each major step. Thus, only those variation are described with reference to the above description of the first preferred embodiment.

Thus, in the first major step, the second preferred embodiment latch layer is formed using steps 190, 192 and 197 essentially identical to those for the first preferred embodiment except for the extension of spaces 212' and 218, as noted above with reference to FIG. 6A.

Figure 21:
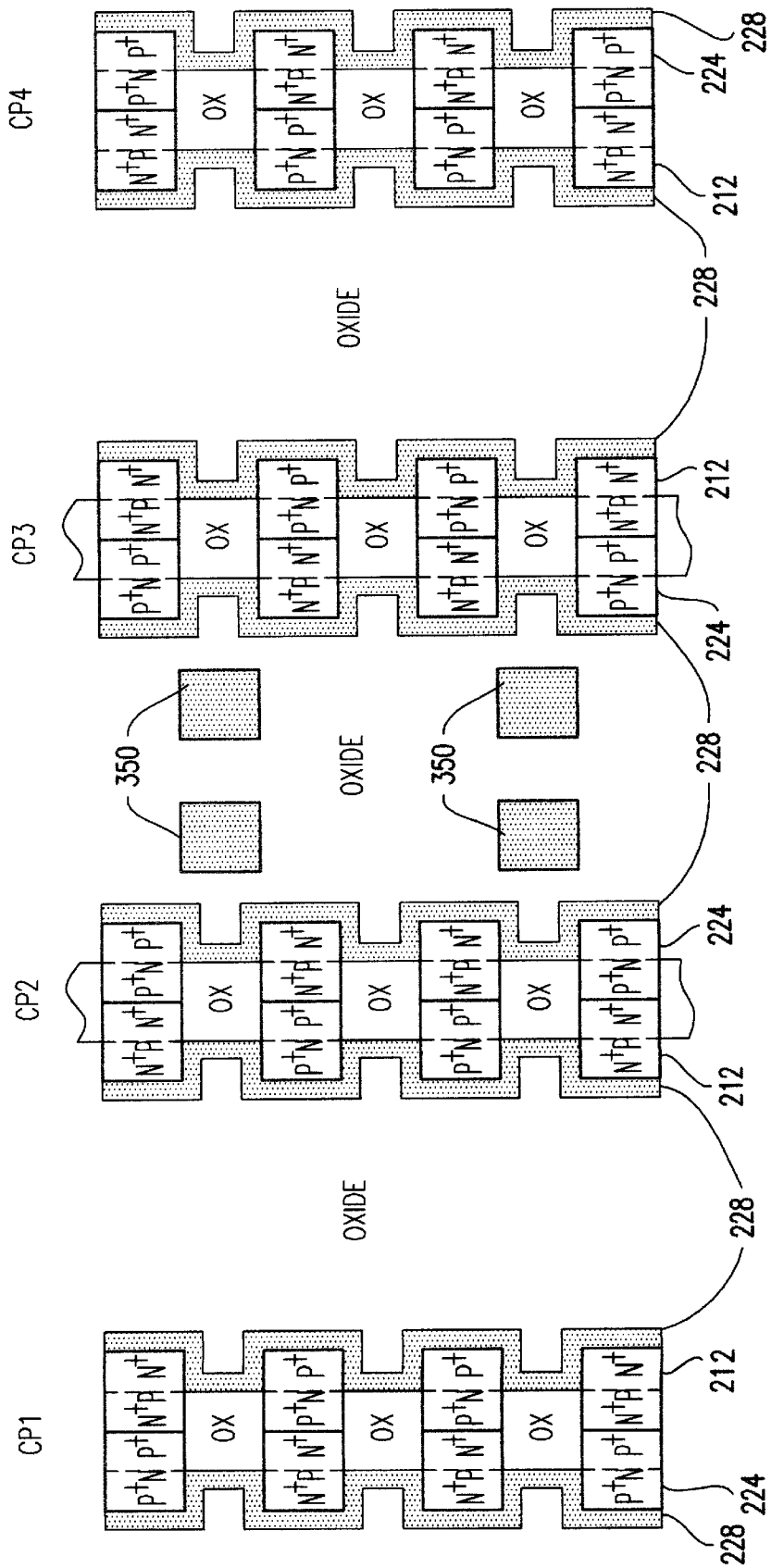
FIGS. 21–25 are plan and corresponding cross-sectional views illustrating the steps in forming a second preferred embodiment SRAM cell.
Figure 22A:
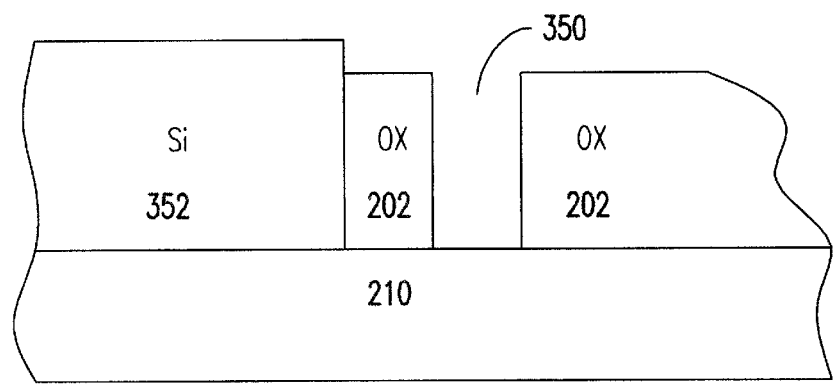
Figure 22B:
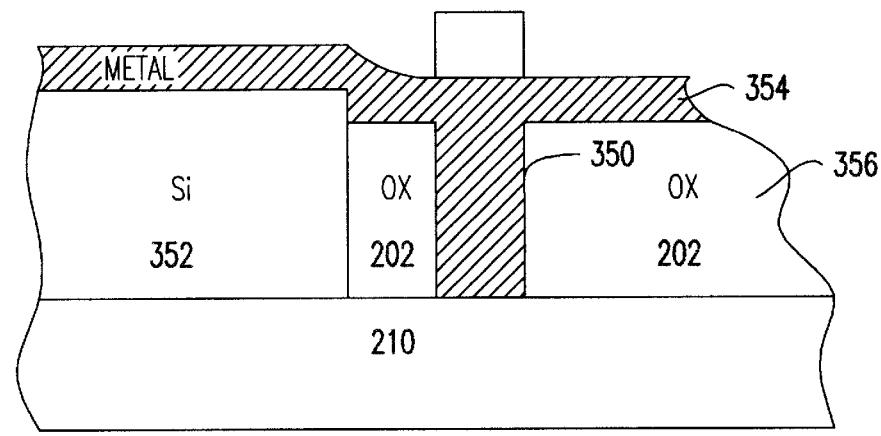
Figure 22C:
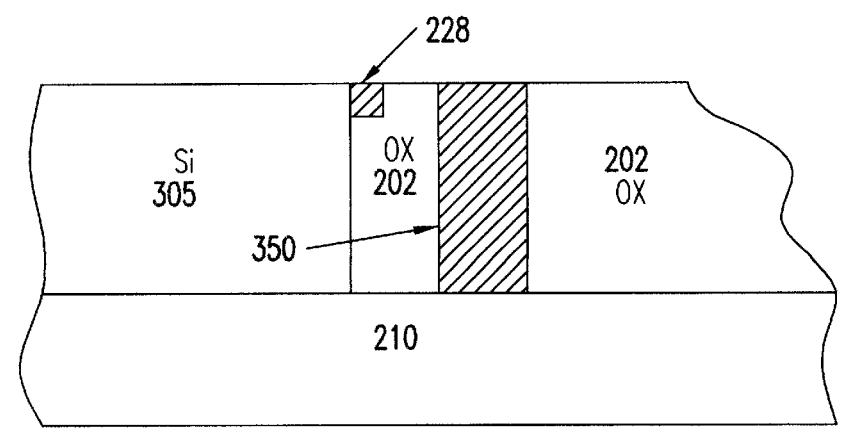

However, represented in FIG. 21, which corresponds to FIGS. 10A–B, vias 350 are opened and filled with conducting material when strap metal is deposited. FIGS. 22A–C represent the steps 1970–4 wherein vias 350 are opened and filled. First in step 1970 as represented in FIG. 22A, vias 350 are opened through oxide layer 202 to the underlying silicon substrate 210. The oxide layer 202 is then recessed below the surface of the NPN and PNP stacks, represented by silicon 352.

Next in step 1972 as represented in FIG. 22B, conducting material 354, preferably metal, is deposited, filling the vias 350, covering recessed oxide 356 and the NPN and PNP stacks. A pattern block mask is formed on the metal 354 to prevent metal removal from vias 350.

In step 1974 as represented in FIG. 22C, the metal layer is selectively removed, preferably using RIE, such that only the strapping lines 228 and metal vias 350 remain. Then TEOS is deposited and the surface is planarized, preferably using CMP. Then, processing continues as described for step 1976 as represented in FIGS. 11 and 12A–B until in step 1978 latch landing pads 246 in FIGS. 13A–B are formed.

Figure 23A:
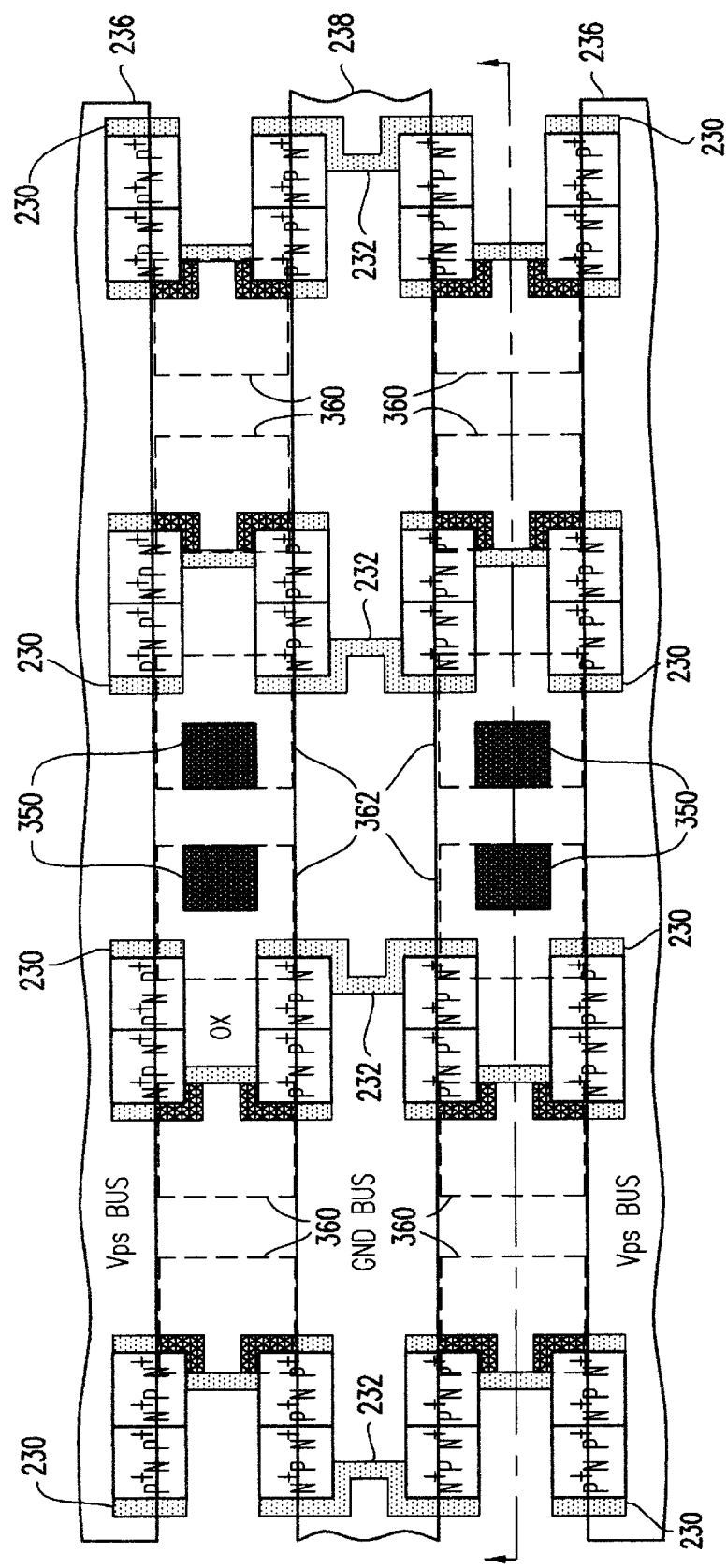
Figure 23B:
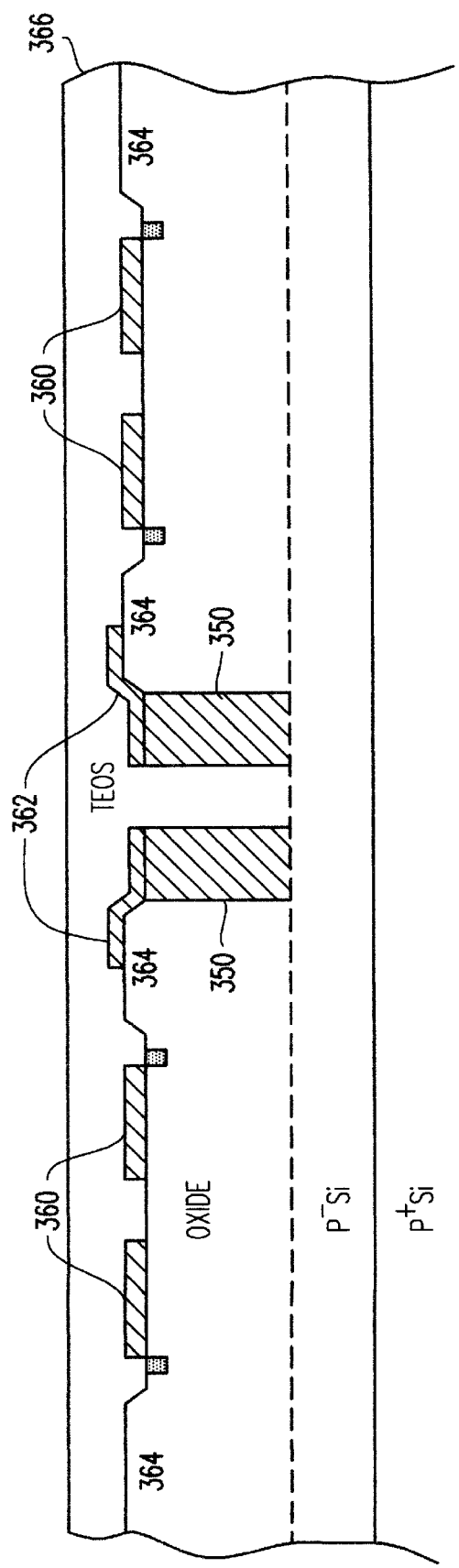

In the second preferred embodiment SRAM, as can be seen in FIGS. 23A–B, individual latch landing pads 360 are provided to each latch and via landing pads 362 are provided to each via 350. These individual landing pads 360, 362 are patterned and formed essentially as describe for the shared latch landing pads 246 in FIGS. 13A–B. Mounds 364, formed when oxide between bus lines 236, 238 is patterned and etched, prevent via pads 362 from shorting to supply wiring 230, 232. As with the step in FIGS. 13A–B, TEOS 366 is deposited and planarized, preferably using CMP. The first major step is complete for the second preferred embodiment SRAM.

The second major step 198 is identical to the second major step 198 of the first preferred embodiment. Thus, the second major step 198 is as describe hereinabove for FIG. 14. Optionally, for this second embodiment, TEOS layer 282 in FIG. 15 may be omitted and the bonding layer 284 deposited directly on P⁻ layer 266.

Figure 24:
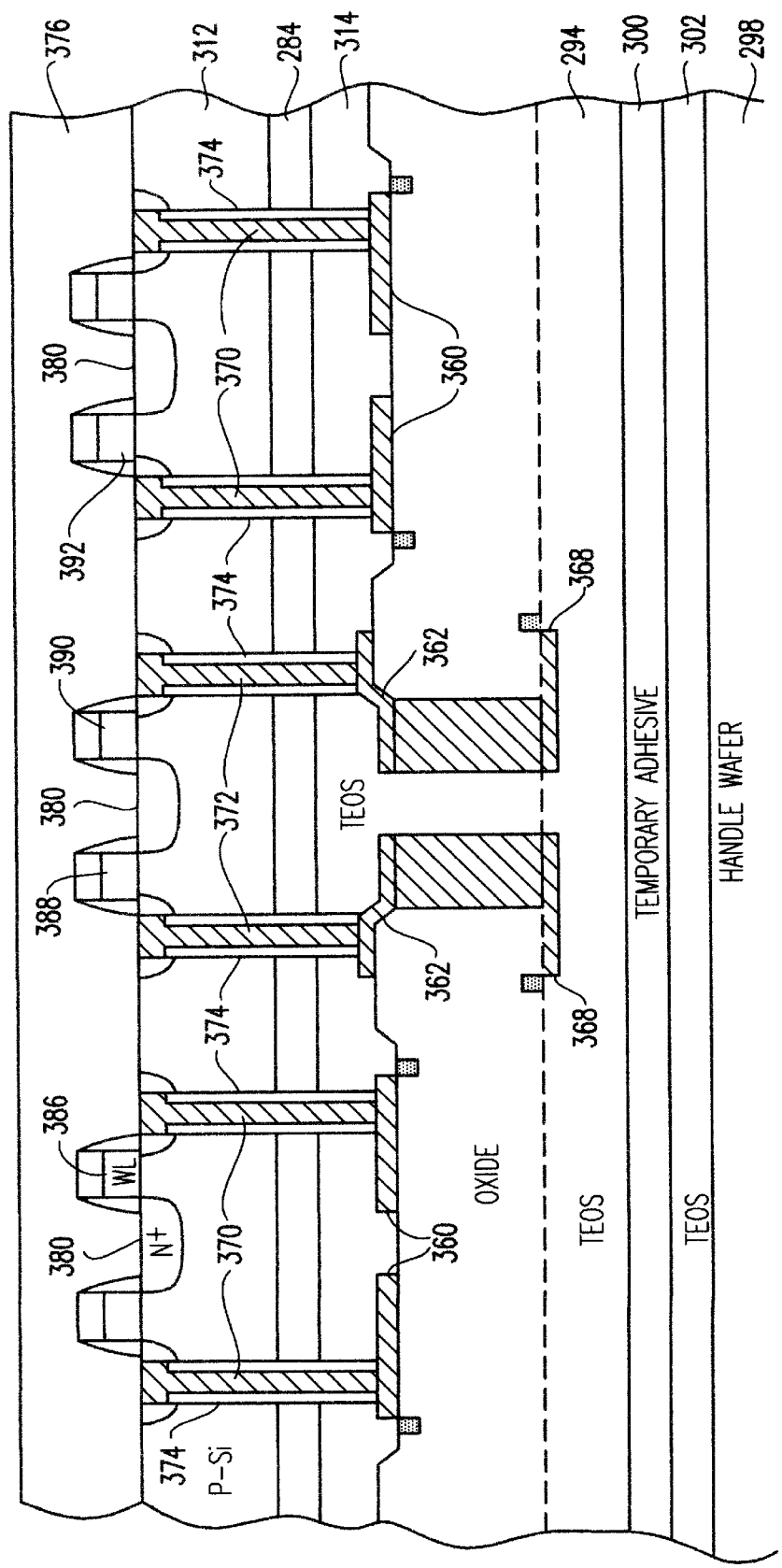

Next, the third major step 199, bonding and interconnecting, proceeds essentially as described above with reference to FIGS. 15–16, except that, as can be seen in FIG. 24, backside landing pads 368 are included. Backside landing pads 368 connect the vias 350 to the cross coupled latch side opposite that connected to latch landing pads 360. Thus, both sides of each latch are available on latch landing pads 360 and via landing pads 362. Further, to provide space for the backside landing pads 368, backside supply and ground lines are not offset from the upper surface lines 236, 238 as in the first preferred embodiment. Thus, top and bottom supply lines and top and bottom ground lines are aligned.

The vertical wiring paths 370, 372, are formed identically to formation of corresponding conduction paths 324, except that vertical wiring paths 370 land on latch landing pads 360 and vertical wiring paths 372 land on via landing pads 362. However, in this embodiment, because of the spacing resulting from the wider spaces, (212', 218 in FIG. 6A) the latch landing pads 360 are not shared and so, do not need to be split.

The spare gate stacks are etched from between the cell columns but, the gate oxide layer (330 in FIG. 19) remains untouched in the area below the removed gate stack. So, gate stack etching begins, as described for trench etching in FIGS. 19–20, by removing nitride cap 334, but ends after removal of gate conductor 336. Alternately, removal of nitride cap 334 and gate conductor 336 may be done prior to forming nitride sidewall liners 320 in FIG. 18, i.e., 374 in FIG. 24. In either case, after forming a BPSG layer 376 as described above for FIG. 20, the resulting structure is shown in FIG. 24.

Figure 25:
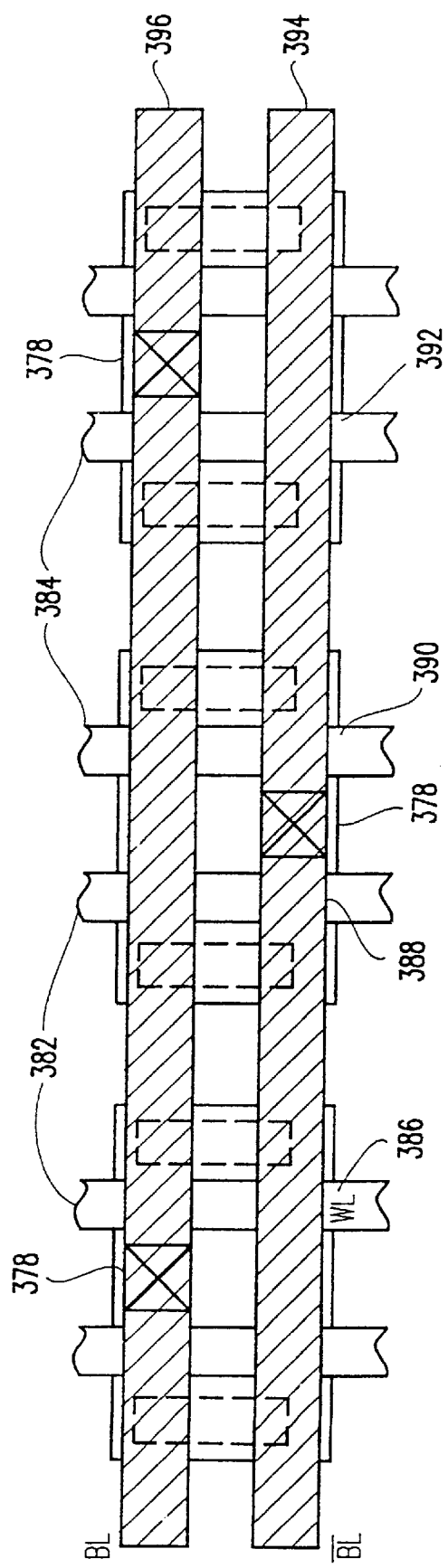

Finally, in this second preferred embodiment as in the first preferred embodiment dense SRAM cell, bit line contacts 378 in FIG. 25 are opened to bit line diffusions 380 and bit lines are formed on the nitride surface using an appropriate process, with two primary differences. First, each word line must control two pass gates per cell. So, in FIG. 25, word lines 382, 384 each include two pass gates 386, 388 and 390, 392, respectively. Second each bit line is a pair of complementary lines, 394, 396.

The third preferred embodiment SRAM cell is, essentially, identical to the second preferred embodiment, except directly coupled vertical pairs are of the same type devices are formed in step 194 as represented in FIG. 1B for improved performance. This preferred embodiment takes advantage of the additional wiring flexibility provided by the metal vias 350 to wire sources 118, 122 of device pairs 100 together and to wire different device type pairs 100 together. Thus, the primary difference between this third preferred embodiment cell and the second preferred embodiment is in the first major step 190, 194 and 197 and, in particular, in the step corresponding to step 192 as represented by FIGS. 5C–D through 9.

Thus, the steps 192, 194 and 197 of the third preferred embodiment array as represented in FIGS. 26A–F may be easily understood with reference to the above description of steps 190, 192 and 197 in forming the array of the first two preferred embodiment SRAM cells. With respect to steps 190 and 197, only the step variations from the first two preferred embodiment cells are described.

Figure 26A:
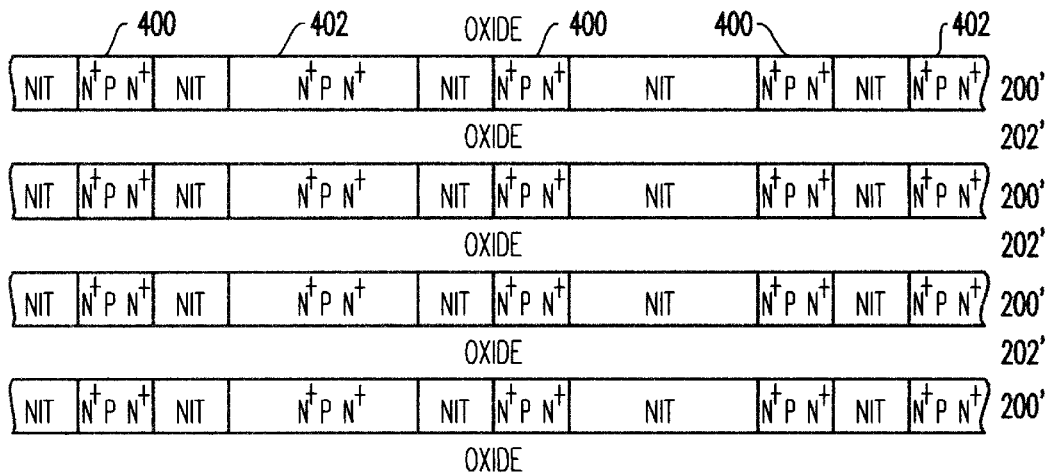
FIGS. 26A–F are plan views illustrating the steps in forming the paired device array in the first major step of the third preferred embodiment performance SRAM of the present invention using the preferred directly coupled pair of FIG. 1B.

First, in step 1906, as represented in FIG. 26A gaps 400, 402 are opened in nitride lines 200' to the silicon substrate. Step 1906 is identical in all preferred embodiments except for the location of gap openings as illustrated in each of the corresponding FIGS. 5C and 26A. Next in step 1940 of FIG. 4E epitaxial N⁺PN⁺ stacks 400, 402 are grown in the gaps.

Figure 26B:
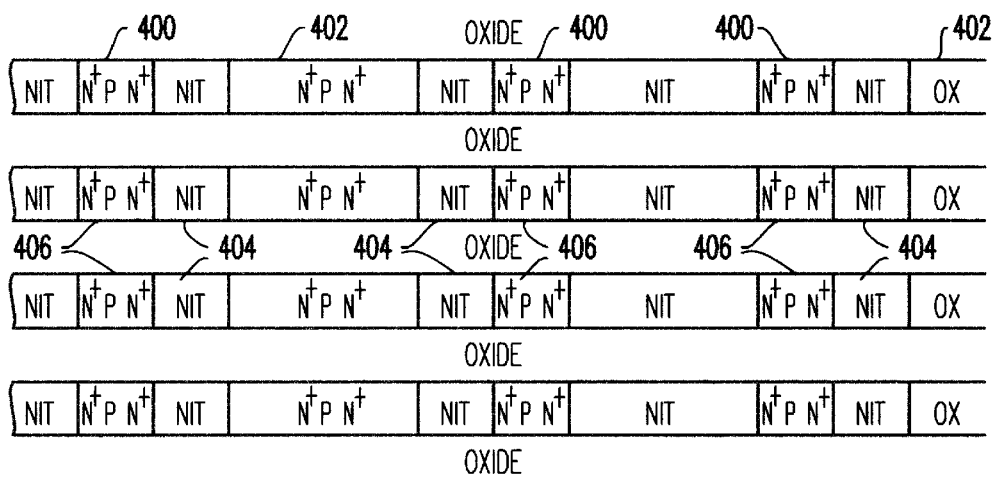

In step 1942 as represented in FIG. 26B, after growing a thin oxide cap on the epi N⁺PN⁺ stacks 400, 402, wide N+PN+ stacks 402 are etched away, opening slots and the open slots are filled with TEOS. In this example of the third preferred embodiment, the remaining epi stacks 400 have a thicker N+ region at the top of the stack than at the bottom.

Figure 26C:
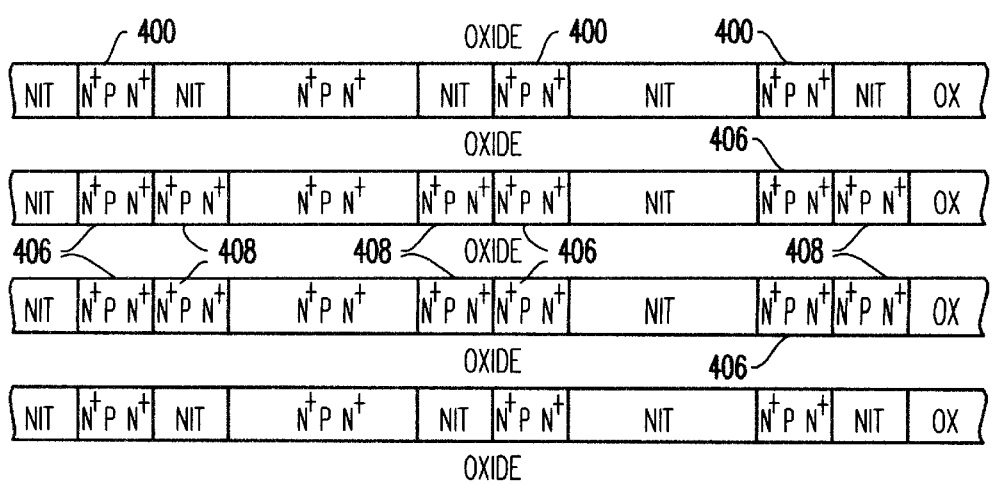

In step 1944 as represented in FIG. 26C, directly coupled NFET pairs are completed by first selectively removing nitride from areas 404, to expose the sidewall of stacks 406. Then in step 1946 gate oxide is formed on the exposed stack sidewall of each of stacks 406 and, then, in steep 1948 a second epi N+PN+ stack 408 is grown adjacent to each of stacks 406. The second epi stacks 408 have a thicker N+ region at the of bottom the stack than at the top.

Figure 26D:
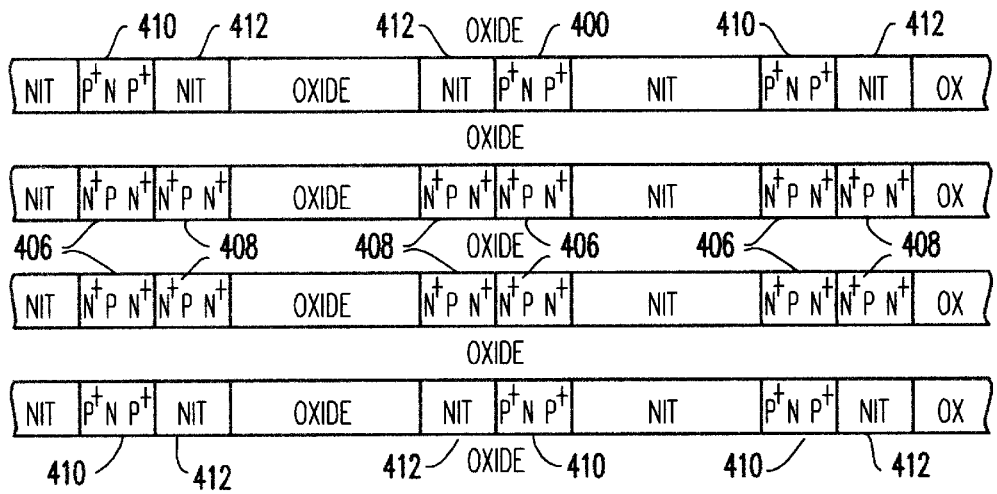

Next in step 1950 as represented in FIG. 26D, temporary stacks are removed opening areas 400 to the surface of the silicon substrate and in step 1952 epitaxial P+NP+ stacks 410 are grown in the opened areas. Epi P+NP+ stacks 410 have a thicker P+ region at the top of the stack than at the bottom. Then, in step 1954 nitride spaces 412 are removed to expose the sidewall of P+NP+ stacks 410. In step 1956 gate oxide is grown on the exposed P+NP+ stack 410 sidewalls.

Figure 26E:
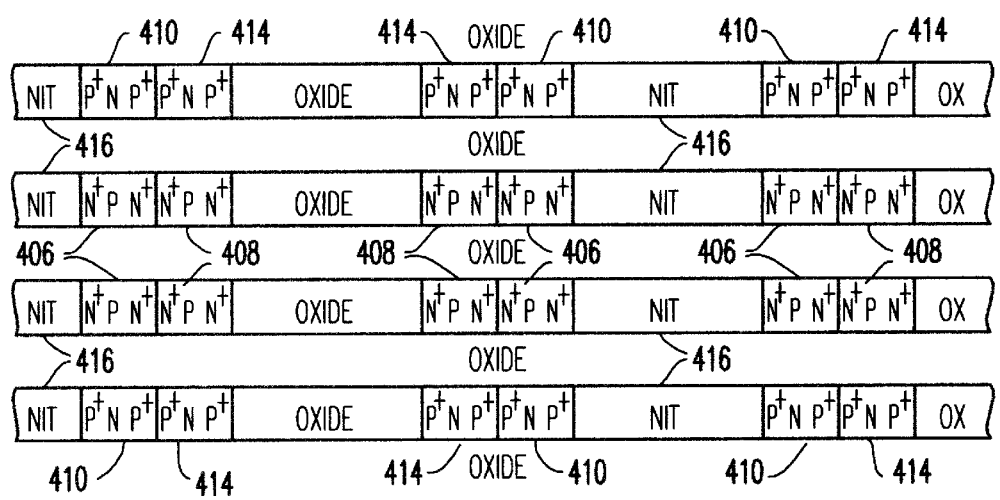

In step 1958 as represented in FIG. 26E P+NP+ stacks 414 are grown. Epi stacks 414 have a thicker P+ region at the bottom of the stack than at the top.

Figure 26F:
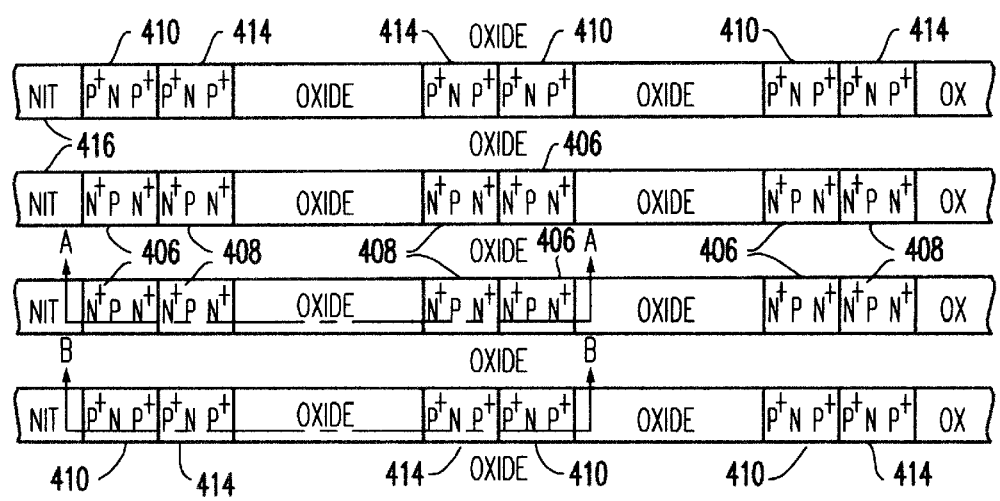

Finally, in step 1960 as represented in FIG. 26F, the remaining nitride 416 is removed. TEOS is deposited and the surface is planarized, preferably using CMP. Growth of the respective region thicknesses is for example only and not intended as a limitation.

Having completed step 194, the latch wiring is formed on the latch layer in step 197, i.e. steps 1970–78. Essentially, the latch interdevice wiring for this high performance SRAM cell embodiment is as described above for the second preferred embodiment SRAM cell, resulting in a latch layer closely resembling FIGS. 23A–B. After forming the latch wiring in step 197, the I/O layer is formed in step 198, and attached and bonded in step 199 to the latch layer.

Figure 27A:
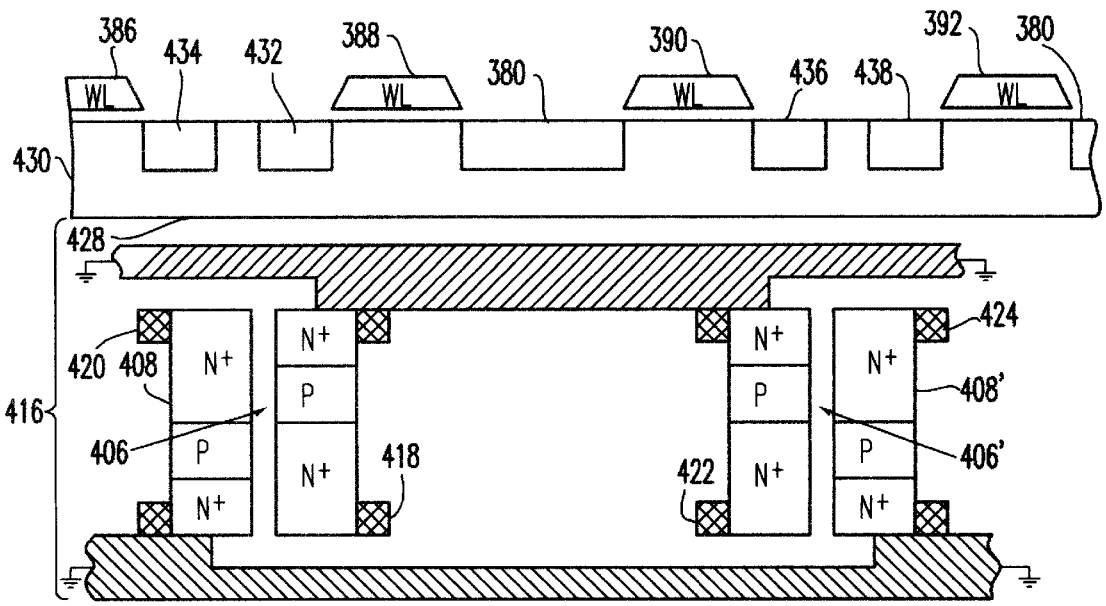
FIGS. 27A–B are cross-sections of two partially complete high performance SRAM cells through an area corresponding to A—A and B—B in FIG. 26F.
Figure 27B:
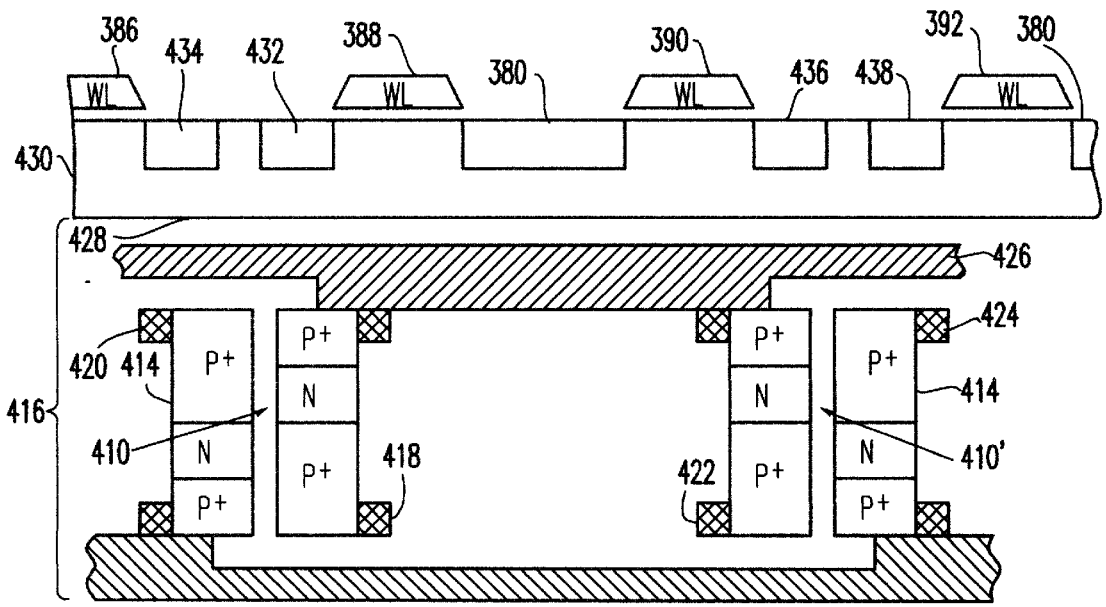

FIGS. 27A–B are cross-sections of two partially complete high performance SRAM cells through an area corresponding to A—A and B—B in FIG. 26F. FIG. 27A represents a cross section through A—A for both pairs of directly coupled NFETs 406, 408 and 406', 408'. FIG. 27B represents a cross section through B—B for both pairs of directly coupled PFETs 410, 414 and 410', 414'.

There are two flip-flop storage nodes shown in FIG. 27A and 27B. The first (left side) flip-flop, also referred to as a latch, is formed when latch wire 418 connects NFET 406 with PFET 410, and latch wire 420 connects NFET 408 with PFET 414. The second (right side) flip-flop (latch) is formed when latch wire 422 connects NFET 406' with PFET 410', and latch wire 424 connects NFET 408' with PFET 424'. The sources of NFETs 406, 408, 406' and 408' are grounded and the sources of PFETs 410, 414, 410' and 414' are connected to a supply voltage 426.

Additionally, layer 430 represents an I/O layer attached to a surface 428 of the latch layer 416. Latch wires 418, 420, 422 and 424 must be wired, vertically, to diffusions 432, 434, 436 and 438, respectively.

Traditional wiring methods are inadequate for connecting the latch devices together and to the I/O layer. Therefore, the high performance embodiment includes sidewall wires 418, 420, 422 and 424 and the interlevel wiring (not shown in FIGS. 27A–B) as is described with reference to FIGS. 23A–B. Connecting the latch layer to the I/O layer is, essentially as described with reference to FIGS. 24–25.

While the invention has been described in terms of a single preferred embodiment, those skilled in the art will recognize that the invention can be practiced with modification within the spirit and scope of the appended claims.

We claim:

1. A latch comprising two pairs of directly coupled vertical Field Effect Transistor (FETs), the drains of each said FET in one said pair being connected to drains of opposite conduction type FETs in the other, said two pairs forming cross coupled invertors, each said pair of directly coupled FETs comprising:

a first stack of layered, epitaxially grown silicon, said first stack having a channel layer of a first conduction type between a pair of conducting terminal layers of a second conduction type, a second stack of layered, epitaxially grown silicon, said second stack having a channel layer of said second conduction type between a pair of conducting terminal layers of said first conduction type, a gate oxide layer of $SiO_2$ separating said first and second stacks, and one of said conducting terminal layers of each of said first and said second stacks being at least as thick as the sum of the thickness of the channel layer and the thickness of the other of said conducting terminal layers of said second and first stacks, each said channel layer of each said stack having a surface facing said thicker conducting terminal layer of the other said stack and separated therefrom by said gate oxide so that said thicker conducting terminal layer of each said epitaxial stack is the gate of one FET of said pair of FETs.

2. The latch of claim 1 wherein each said pair of FETs includes a NFET and a PFET.

3. An array of Static Random Access Memory (SRAM) cells, each said SRAM cell including a storage latch as in claim 2.

4. The SRAM array of claim 3 wherein each said SRAM cell includes at least one pass gate, said at least one pass gate being a FET in a layer above said storage latch and coupling one side of said storage latch to a bit line.

5. The SRAM array of claim 4 wherein at least one pass gate is one pass gate.

6. The SRAM array of claim 4 wherein at least one pass gate is two pass gates, said bit line being a complementary pair of lines said two pass gates coupling said storage latch to said complementary bit line pair.

7. The latch of claim 1 wherein one said pair of FETs is a pair of NFETs and the other said pair is a pair of PFETs.

8. An array of Static Random Access Memory (SRAM) cells, each said SRAM cell including a storage latch as in claim 7.

9. The SRAM array of claim 8 wherein each said SRAM cell includes at least one pass gate, said at least one pass gate being a FET in a layer above said storage latch and coupling one side of said storage latch to a bit line.

10. The SRAM array of claim 9 wherein at least one pass gate is one pass gate.

* * * * *